US011018804B2

(12) United States Patent
Jiang et al.

(10) Patent No.: US 11,018,804 B2
(45) Date of Patent: May 25, 2021

(54) BIT ALLOCATIONS FOR ENCODING AND DECODING

(71) Applicant: Qualcomm Incorporated, San Diego, CA (US)

(72) Inventors: Jing Jiang, San Diego, CA (US); Gabi Sarkis, San Diego, CA (US); Yang Yang, San Diego, CA (US); Shrinivas Kudekar, Raritan, NJ (US); Joseph Binamira Soriaga, San Diego, CA (US); Hari Sankar, San Diego, CA (US); Changlong Xu, Beijing (CN); Chao Wei, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/467,463

(22) PCT Filed: Dec. 7, 2017

(86) PCT No.: PCT/CN2017/115029
§ 371 (c)(1),
(2) Date: Jun. 6, 2019

(87) PCT Pub. No.: WO2018/126840
PCT Pub. Date: Jul. 12, 2018

(65) Prior Publication Data
US 2020/0099469 A1 Mar. 26, 2020

Related U.S. Application Data

(60) Provisional application No. 62/444,368, filed on Jan. 9, 2017.

(30) Foreign Application Priority Data

Jan. 17, 2017 (WO) ................ PCT/CN2017/071363

(51) Int. Cl.
*H04L 27/00* (2006.01)
*H04L 1/00* (2006.01)

(52) U.S. Cl.
CPC .......... *H04L 1/0057* (2013.01); *H04L 1/0041* (2013.01)

(58) Field of Classification Search
CPC ........................... H04L 1/0057; H04L 1/0041
(Continued)

(56) References Cited

U.S. PATENT DOCUMENTS 10,287,506 B2    5/2019  Lin et al.
10,623,138 B2 *  4/2020  Yang .................... H04L 1/0058
(Continued)

FOREIGN PATENT DOCUMENTS

CN    104539393 A    4/1920
CN    102122966 A    7/2011
(Continued)

OTHER PUBLICATIONS

He G., et al., "β-expansion: A Theoretical Framework for Fast and Recursive Construction of Polar Codes", IEEE Global Communications Conference on Information Theory, Apr. 19, 2017, 7 pages.
(Continued)

*Primary Examiner* — Tesfaldet Bocure
(74) *Attorney, Agent, or Firm* — Holland & Hart LLP

(57) ABSTRACT

Methods, systems, and devices for encoding and decoding are described. To encode a vector, an encoder allocates information bits of the vector to channel instances of a channel that are separated into groups. The groups may vary in size and allocation of the information bits is based on a base sequence of a given length. During decoding, a decoder assigns different bit types to channels instances by dividing
(Continued)

a codeword into a plurality of groups and assigning bit types to channel instances of the plurality of groups using the base sequence.

30 Claims, 17 Drawing Sheets

(58) Field of Classification Search
USPC ......................................................... 375/295
See application file for complete search history.

(56) References Cited

U.S. PATENT DOCUMENTS

| | | | |
|---|---|---|---|
| 2005/0160350 | A1 | 7/2005 | Dror et al. |
| 2015/0295593 | A1 | 10/2015 | Trifonov et al. |
| 2016/0308644 | A1 | 10/2016 | Shen et al. |
| 2017/0149531 | A1 | 5/2017 | Raza et al. |
| 2017/0214416 | A1 | 7/2017 | Ge et al. |
| 2018/0167946 | A1* | 6/2018 | Si ..................... H04W 72/1252 |
| 2018/0175976 | A1* | 6/2018 | Kim ..................... H04L 1/0086 |
| 2018/0198564 | A1 | 7/2018 | Yang et al. |
| 2018/0205496 | A1 | 7/2018 | Kudekar et al. |
| 2018/0323809 | A1 | 11/2018 | Lin et al. |
| 2018/0351695 | A1 | 12/2018 | Yang et al. |
| 2018/0351696 | A1 | 12/2018 | Yang et al. |
| 2019/0052487 | A1* | 2/2019 | Shelby ................. H04L 1/0061 |
| 2019/0181979 | A1* | 6/2019 | Wang .................... H04L 1/0068 |
| 2019/0199480 | A1* | 6/2019 | Kim .................. H03M 13/6306 |
| 2019/0245560 | A1* | 8/2019 | Yang .................... H04L 1/0057 |
| 2019/0393986 | A1* | 12/2019 | Wang ................ H03M 13/6362 |

FOREIGN PATENT DOCUMENTS

| | | |
|---|---|---|
| CN | 105430395 A | 3/2016 |
| CN | 106027071 A | 10/2016 |
| EP | 0968497 A1 | 1/2000 |
| WO | WO-9815945 A1 | 4/1998 |
| WO | WO-2006076213 A1 | 7/2006 |
| WO | WO 2011/014738 A2 | 2/2011 |
| WO | WO-2015066925 A1 | 5/2015 |

OTHER PUBLICATIONS

International Search Report and Written Opinion—PCT/CN2017/071363—ISA/EPO—dated Sep. 27, 2017.
International Search Report and Written Opinion—PCT/CN2017/115029—ISA/EPO—dated Feb. 24, 2018.
Niu K., et al., "Polar Codes: Primary Concepts and Practical Decoding Algorithms", IEEE Communications Magazine, IEEE Service Center, Piscataway, US, vol. 52, No. 7, Jul. 2014, pp. 192-203, XP011553413, ISSN: 0163-6804, DOI: 10.1109/MCOM.2014.6852102 [retrieved on Jul. 10, 2014].
Mori R., et al., "Performance and Construction of Polar Codes on Symmetric Binary-Input Memoryless Channels", IEEE International Symposium on Information Theory, URL: http://www.arxiv.org/, Cornell University Library. 201, Olin Library Cornell University Ithaca, NY 14853, May 23, 2009, 5 Pages, XP080357263, DOI: 10.1109/ISIT.2009.5205857, Section III.
Balatsoukas-Stimming A., et al., "Enabling Complexity-Performance Trade-Offs for Successive Cancellation Decoding of Polar Codes", 2014 IEEE International Symposium on Information Theory, IEEE, Jun. 29, 2014, XP032635343, DOI: 10.1109/ISIT.2014.6875380 [retrieved on Aug. 8, 2014], pp. 2977-2981.
Samsung: "Discussion on Flexible Polar Codes", 3GPP Draft; R1-166773 Discussion_On_Flexibile_Polar_Codes, 3rd Generation Partnership Project (3GPP), Mobile Competence Centre; 650, Route Des Lucioles; F-06921 Sophia-Antipolis Cedex; France, vol. RAN WG1, No. Gothenbourg, Sweden; Aug. 22, 2016-Aug. 26, 2016 Aug. 13, 2016, XP051142464, Retrieved from the Internet: URL:http://www.3gpp.org/ftp/tsg_ran/WG1_RL1/TSGR1_86/Docs/ [retrieved on Aug. 13, 2016], 4 pages.
Tal I., et al., "How to Construct Polar Codes", IEEE Transactions on Information Theory, Apr. 10, 2013, pp. 1-21.
Tal I., et al., "List Decoding of Polar Codes", IEEE Transactions on Information Theory, May 31, 2012, pp. 1-11.
Trifonov P., "Efficient Design and Decoding of Polar Codes", IEEE Transactions on Communications, vol. 60, No. 11, Nov. 1, 2012, XP011473857, ISSN: 0090-6778, DOI: 10.1109/TCOMM.2012.081512.110872, pp. 3221-3227.
Erdal Arikan; Channel Polarization: A Method for Constructing Capacity-Achieving Codes 2008 IEEE International Symposium on Information Theory—Aug. 8, 2008; ISIT 2008, Toronto, Canada, Jul. 6-11, 2008.
Chen K., et al., "Polar Coded HARQ Scheme with Chase Combining", 2014 IEEE Wireless Communications and Networking Conference (WCNC), IEEE, Apr. 6, 2014 (Apr. 6, 2014), pp. 474-479, XP032683031, DOI: 10.1109/WCNC.2014.6952074 [retrieved on Nov. 10, 2014].
Qualcomm Incorporated: "Polar HARQ", 3GPP TSG-RAN WG1 #86, 3GPP Draft; R1-166371_Polar HARQ, 3rd Generation Partnership Project (3GPP), Mobile Competence Centre; 650, Route Des Lucioles; F-06921 Sophia-Antipolis Cedex; France, vol. RAN WG1, No. Gothenburg, Sweden; Aug. 22, 2016-Aug. 26, 2016, Aug. 21, 2016 (Aug. 21, 2016), 9 Pages, XP051140190, Retrieved from the Internet: URL: http://www.3gpp.org/ftp/Meetings_3GPP_SYNC/RAN1/Docs/ [retrieved on Aug. 21, 2016] the whole document.
Supplementary European Search Report—EP17890151—Search Authority—Munich—Sep. 29, 2020.
Taiwan Search Report—TW107100780—TIPO—dated Mar. 26, 2021

* cited by examiner

BIT ALLOCATIONS FOR ENCODING AND DECODING

CROSS REFERENCES

The present 371 Application for Patent claims priority to PCT international Patent Application No. PCT/CN2017/115029 to JIANG et al., titled "BIT ALLOCATION FOR ENCODING AND DECODING", filed Dec. 7, 2017, and to PCT International Patent Application No. PCT/CN2017/071363 to JIANG et. al, titled "BIT ALLOCATION FOR ENCODING AND DECODING", filed Jan. 17, 2017, and to U.S. Provisional Patent Application No. 62/444,368 to JIANG et. al, titled "BIT ALLOCATION FOR ENCODING AND DECODING", filed Jan. 9, 2017, each of which are assigned to the assignee hereof.

TECHNICAL FIELD

Certain aspects of the disclosure relate generally to encoding by an encoder and/or decoding by a decoder, and more specifically to bit allocation for encoding and/or decoding.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FI) MA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Code blocks may be encoded by a transmitting device (e.g., a base station or UE) using an encoding algorithm. Error correcting codes may be used to introduce redundancy in a code block so that transmission errors may be detected and corrected. Some examples of encoding algorithms with error correcting codes include convolutional codes (CCs), low-density parity-check (LDDC) codes, and polar codes. Some coding techniques, such as polar coding, use reliability metrics during encoding and decoding such that information bits may be loaded on channel instances (of the encoder or decoder) that are associated with favorable (e.g., high) reliability metrics. Such techniques, however, may require a large amount of storage and/or may be computationally complex or resource heavy. Improved techniques for bit allocation (e.g., among channel instances) for encoding and decoding may be desired.

SUMMARY

The described techniques relate to improved methods, systems, devices, or apparatuses that support bit allocation for encoding and decoding. Generally, the described techniques provide for encoding in which an encoder allocates information bits of a vector to channel instances of a channel. The channel instances are partitioned or grouped that vary in size. The vector may be recursively polarized until a given length group is reached. The given length may be the same as a base sequence length and the base sequence(s) may be used to indicate locations of information bits, frozen bits, or parity bits within the group. By recursively polarizing one or more vectors or groups within the vector, locations of information bits, frozen bits, or parity bits may be determined using one base sequence or more than one base sequences. During decoding, a decoder may use the base sequence to assign different bit types to channels instances corresponding to each group. The decoder may divide a codeword into a plurality of groups and assign a bit type to one or more channel instances of the plurality of groups based on a number of information bits allocated to a given group and group size.

A method of encoding by an encoder is described. The method may include identifying a plurality of channel instances of a channel associated with transmission of a vector comprising a first plurality of information bits, wherein the plurality of channel instances are recursively polarized into one or more groups, allocating the first plurality of information bits among the one or more groups based at least in part on a reliability metric associated with the channel, performing an encoding operation to encode the vector based at least in part on the allocation of the first plurality of information bits among the one or more groups and a size of at least one of the one or more groups, and transmitting the encoded vector using the plurality of channel instances.

An apparatus fir encoding is described. The apparatus may include means for identifying a plurality of channel instances of a channel associated with transmission of a vector comprising a first plurality of information bits, wherein the plurality of channel instances are recursively polarized into one or more groups, means for allocating the first plurality of information bits among the one or more groups based at least in part on a reliability metric associated with the channel, means for performing an encoding operation to encode the vector based at least in part on the allocation of the first plurality of information bits among the one or more groups and a size of at least one of the one or more groups, and means for transmitting the encoded vector using the plurality of channel instances.

Another apparatus for encoding is described. The apparatus may include a processor, memory in electronic communication with the processor, and instructions stored in the memory. The instructions may be operable to cause the processor to identify a plurality of channel instances of a channel associated with transmission of a vector comprising a first plurality of information bits, wherein the plurality of channel instances are recursively polarized into one or more groups, allocate the first plurality of information bits among the one or more groups based at least in part on a reliability metric associated with the channel, perform an encoding operation to encode the vector based at least in part on the allocation of the first plurality of information hits among the one or more groups and a size of at least one of the one or more groups, and transmit the encoded vector using the plurality of channel instances.

A non-transitory computer readable medium for encoding is described. The non-transitory computer-readable medium may include instructions operable to cause a processor to identify a plurality of channel instances of a channel associated with transmission of a vector comprising a first plurality of information bits, wherein the plurality of channel instances are recursively polarized into one or more groups, allocate the first plurality of information bits among the one or more groups based at least in part on a reliability metric associated with the channel, perform an encoding operation to encode the vector based at least in part on the allocation of the first plurality of information bits among the one or more groups and a size of at least one of the one or more groups, and transmit the encoded vector using the plurality of channel instances.

Some examples of the method, apparatus, and non-transitory computer-readable medium described above may further include processes, features, means, or instructions for retransmitting, using one or more of the plurality of channel instances, a portion of the encoded vector based at least in part on reception of a negative acknowledgement (NACK) message.

In some examples of the method, apparatus, and non-transitory computer-readable medium described above, retransmitting the portion of the encoded vector comprises: retransmitting each of the first plurality of information bits.

In some examples of the method, apparatus, and non-transitory computer-readable medium described above, retransmitting the portion of the encoded vector comprises: allocating, among one or more of the groups, a second plurality of information bits associated with the portion of the encoded vector, the second plurality of information bits corresponding to respective ones of the first plurality of information bits.

In some examples of the method, apparatus, and non-transitory computer-readable medium described above, a bit location for at least one of the first plurality of information bits during transmission of the encoded vector may be different from a bit location for a respective information bit of the second plurality of information bits during retransmission of the encoded vector.

In some examples of the method, apparatus, and non-transitory computer-readable medium described above, bit locations for each of the first plurality of information bits may be different from bit locations of respective information bits of the second plurality of information bits.

In some examples of the method, apparatus, and non-transitory computer-readable medium described above, the vector comprises a plurality of encoded bits determined based at least in part on a vector of encoded input bits comprising a set of information bits and a set of frozen bits.

In some examples of the method, apparatus, and non-transitory computer-readable medium described above, the reliability metric may be associated with a corresponding equivalent channel after a polarization operation.

Some examples of the method, apparatus, and non-transitory computer-readable medium described above may further include processes, features, means, or instructions for storing a base sequence for information bit allocation corresponding to a given group size and a given number of information bit locations associated with the given group size. Some examples of the method, apparatus, and non-transitory computer-readable medium described above may further include processes, features, means, or instructions for determining one or more information bit locations for a group based at least in part on a number of information bits allocated to the group and the associated base sequence.

Some examples of the method, apparatus, and non-transitory computer-readable medium described above may further include processes, features, means, or instructions for storing one or more base sequences, each of the one or more base sequences may be used in conjunction with at least one of a given group size or a given number of information bit locations associated with the given group size to determine the information bit allocation of that group.

In some examples of the method, apparatus, and non-transitory computer-readable medium described above, each of the one or more base sequences may be determined based at least in part on a density evolution technique, a density evolution based at least in part on a Gaussian approximation (mean value evolution) technique, a mutual information evolution technique, a mean square error density evolution technique, or a polarization weight technique. In some other examples of the method, apparatus, and non-transitory computer-readable medium described above, each of the one or more base sequences may be obtained via computer search through simulations.

In some examples of the method, apparatus, and non-transitory computer-readable medium described above, the allocating the first plurality of information bits among one or more of the groups may be based at least in part on a base sequence based on the size of at least one of one or more groups.

In some examples of the method, apparatus, and non-transitory computer-readable medium described above, the base sequence may be not based on the size of the vector.

In some examples of the method, apparatus, and non-transitory computer-readable medium described above, the given group size and the number of information bits allocated to the group may determine the information bit locations.

In some examples of the method, apparatus, and non-transitory computer-readable medium described above, the reliability metric of the channel comprises a capacity of the channel, a reliability of the channel, an information rate of the channel, a mean square error of the channel, or combinations thereof.

In some examples of the method, apparatus, and non-transitory computer-readable medium described above, the encoding operation comprises at least one of a polar coding operation, a Reed-Muller (RM) coding operation, or a polar RM operation.

In some examples of the method, apparatus, and non-transitory computer-readable medium described above, the allocating the first plurality of information bits comprises: determining a first output rate associated with a first group of the one or more groups. Some examples of the method, apparatus, and non-transitory computer-readable medium described above may further include processes, features, means, or instructions for determining a number of information bits to be allocated to the first group based at least in part on the first output rate. The allocation may be performed recursively.

In some examples of the method, apparatus, and non-transitory computer-readable medium described above, the determining the first output rate may be based at least in part on data indicating a relationship between one or more channel instances and the channel(s) before polarization. The channel(s) prior to polarization may be different due to, for example, puncturing/shortening/repetition or bit modulation mapping.

In some examples of the method, apparatus, and non-transitory computer-readable medium described above, the data may be for at least one of a binary erasure channel (BEC), a binary symmetric channel (BSC), an additive white Gaussian noise (AWGN) channel, or combinations thereof.

Some examples of the method, apparatus, and non-transitory computer-readable medium described above may further include processes, features, means, or instructions for computing an information bit allocation for each of the first group and the second group based at least in part on a total number of information bits to be allocated and the reliability metric.

In some examples of the method, apparatus, and non-transitory computer-readable medium described above, the allocating the first plurality of information bits further comprises: determining a second output rate associated with a second group of the one or more groups. Some examples of the method, apparatus, and non-transitory computer-readable medium described above may further include processes, features, means, or instructions for determining a number of information bits to be allocated to the second group based at least in part on the second output rate.

In some examples of the method, apparatus, and non-transitory computer-readable medium described above, an average of first output rate and the second output rate equals the original channel rate before polarization. In some examples, the original channel rate may be derived from the code rate. Each channel instance of the original channel may not be the same due to, for example, puncturing/shortening or bit modulation mapping.

In some examples of the method, apparatus, and non-transitory computer-readable medium described above, the first output rate may be based at least in part on a size of the first group, the second output rate may be based at least in part on a size of the second group, and the first and second output rates may be based at least in part on a total number of information bits allocated to the first and second groups.

In some examples of the method, apparatus, and non-transitory computer-readable medium described above, a group size may be not a power of 2 and may contain punctured or shortened bits.

A method of decoding by a decoder is described. The method may include receiving a codeword for decoding, the codeword comprising a first plurality of information bits, identifying a plurality of channel instances of a channel associated with reception of the codeword, wherein the plurality of channel instances are recursively polarized into a plurality of groups, assigning bit types to at least a subset of the plurality of channel instances based at least in part on a reliability metric associated with the channel and a size of at least one of the plurality of groups, and performing a decoding operation of one or more portions of the codeword to obtain the first plurality of information bits based at least in part on the assigned bit types.

An apparatus for decoding is described. The apparatus may include means for receiving a codeword for decoding, the codeword comprising a first plurality of information bits, means for identifying a plurality of channel instances of a channel associated with reception of the codeword, wherein the plurality of channel instances are recursively polarized into a plurality of groups, means for assigning bit types to at least a subset of the plurality of channel instances based at least in part on a reliability metric associated with the channel and a size of at least one of the plurality of groups, and means for performing a decoding operation of one or more portions of the codeword to obtain the first plurality of information bits based at least in part on the assigned bit types.

Another apparatus for decoding is described. The apparatus may include a processor, memory in electronic communication with the processor, and instructions stored in the memory. The instructions may be operable to cause the processor to receive a codeword for decoding, the codeword comprising a first plurality of information bits, identify a plurality of channel instances of a channel associated with reception of the codeword, wherein the plurality of channel instances are recursively polarized into a plurality of groups, assign bit types to at least a subset of the plurality of channel instances based at least in part on a reliability metric associated with the channel and a size of at least one of the plurality of groups, and perform a decoding operation of one or more portions of the codeword to obtain the first plurality of information bits based at least in part on the assigned bit types.

A non-transitory computer readable medium for decoding is described. The non-transitory computer-readable medium may include instructions operable to cause a processor to receive a codeword for decoding, the codeword comprising a first plurality of information bits, identify a plurality of channel instances of a channel associated with reception of the codeword, wherein the plurality of channel instances are recursively polarized into a plurality of groups, assign bit types to at least a subset of the plurality of channel instances based at least in part on a reliability metric associated with the channel and a size of at least one of the plurality of groups, and perform a decoding operation of one or more portions of the codeword to obtain the first plurality of information bits based at least in part on the assigned bit types.

Some examples of the method, apparatus, and non-transitory computer-readable medium described above may further include processes, features, means, or instructions for transmitting, upon an unsuccessful decoding operation, a NACK message.

Some examples of the method, apparatus, and non-transitory computer-readable medium described above may further include processes, features, means, or instructions for receiving retransmission(s) and/or original transmissions of at least a portion of the codeword comprising a second plurality of information bits, wherein a hit location for at least one information bit of the second plurality of information bits may be different from a bit location of a respective information bit of the first plurality of information bits. In such examples, information allocated to non-overlapping bit locations in the first and second plurality of information bits may be copied from the locations in retransmission to the locations of the initial transmission, e.g., in order to keep the overall polar received codeword consistent across IR-HARQ transmissions.

In some examples of the method, apparatus, and non-transitory computer-readable medium described above, the reception of the codeword comprises a reception portion and an exclusive or portion in a polarization transform.

In some examples of the method, apparatus, and non-transitory computer-readable medium described above, the reliability metric may be associated with a corresponding equivalent channel after a polarization operation.

Some examples of the method, apparatus, and non-transitory computer-readable medium described above may further include processes, features, means, or instructions for storing a base sequence for information hit allocation corresponding to a given group size and a given number of information bit locations associated with the given group size, Some examples of the method, apparatus, and non-transitory computer-readable medium described above may further include processes, features, means, or instructions for determining one or more information bit locations for a group based at least in part on a number of information bits allocated to the group and the common base sequence.

Some examples of the method, apparatus, and non-transitory computer-readable medium described above may further include processes, features, means, or instructions for storing one or more base sequences, each of the one or more base sequences based on at least one of a given group size or the information bit location associated with the given group.

Some examples of the method, apparatus, and non-transitory computer-readable medium described above may further include processes, features, means, or instructions for determining one or more information bit locations for a group based at least in part on the number of information bits and one or more base sequences of the plurality of base sequences.

In some examples of the method, apparatus, and non-transitory computer-readable medium described above, the assigning the bit types may be based at least in part on a base sequence based on the size of at least one of the plurality of groups and a number of information bits allocated to the at least one of the plurality of groups.

In some examples of the method, apparatus, and non-transitory computer-readable medium described above, the base sequence may be not based on the size of the codeword.

In some examples of the method, apparatus, and non-transitory computer-readable medium described above, each of the one or more base sequences may be determined based at least in part on a density evolution technique, a density evolution based at least in part on a Gaussian approximation (mean value evolution) technique, a mutual information evolution technique, a mean square error density evolution technique, or a polarization weight technique. In some other examples of the method, apparatus, and non-transitory computer-readable medium described above, each of the one or more base sequences may be obtained via computer search through simulations.

In some examples of the method, apparatus, and non-transitory computer-readable medium described above, the given group size may be constant.

In some examples of the method, apparatus, and non-transitory computer-readable medium described above, the reliability metric of the channel comprises a capacity of the channel, a reliability of the channel, an information rate of the channel, a mean square error of the channel, or combinations thereof.

In some examples of the method, apparatus, and non-transitory computer-readable medium described above, the decoding operation comprises at least one of a polar coding operation, an RM coding operation, a belief propagation decoding operation for low-density parity-check (LDDC) codes, or a polar RM operation.

In some examples of the method, apparatus, and non-transitory computer-readable medium described above, the assigning the bit types comprises: determining a first output rate associated with a first group of the plurality of groups. Some examples of the method, apparatus, and non-transitory computer-readable medium described above may further include processes, features, means, or instructions for determining a number of information bit types to be assigned to the first group based at least in part on the first output rate.

In some examples of the method, apparatus, and non-transitory computer-readable medium described above, the assigning the bit types further comprises: determining a second output rate associated with a second group of the plurality of groups. Some examples of the method, apparatus, and non-transitory computer-readable medium described above may further include processes, features, means, or instructions for determining a number of information bit types to be assigned to the second group based at least in part on the second output rate.

In some examples of the method, apparatus, and non-transitory computer-readable medium described above, an average of the first output rate and the second output rate equals an average of the original channel set before polarization.

In some examples of the method, apparatus, and non-transitory computer-readable medium described above, the first output rate may be based at least in part on a size of the first group and the second output rate may be based at least in part on a size of the second group.

In some examples of the method, apparatus, and non-transitory computer-readable medium described above, the determining the first output rate may be based on data indicating a relationship between one or more channel instances and the channel(s) before polarization. Channel instances prior to polarization may be different due to, for example, puncturing/shortening/repetition or bit modulation mapping.

In some examples of the method, apparatus, and non-transitory computer-readable medium described above, the data may be for at least one of a BEC, a BSC, an AWGN channel, or combinations thereof.

In some examples of the method, apparatus, and non-transitory computer-readable medium described above, the bit types comprise information bits, frozen bits, parity bits, or any combination thereof.

In some examples of the method, apparatus, and non-transitory computer-readable medium described above, a group size may be not a power of 2.

DETAILED DESCRIPTION

Figure 1:
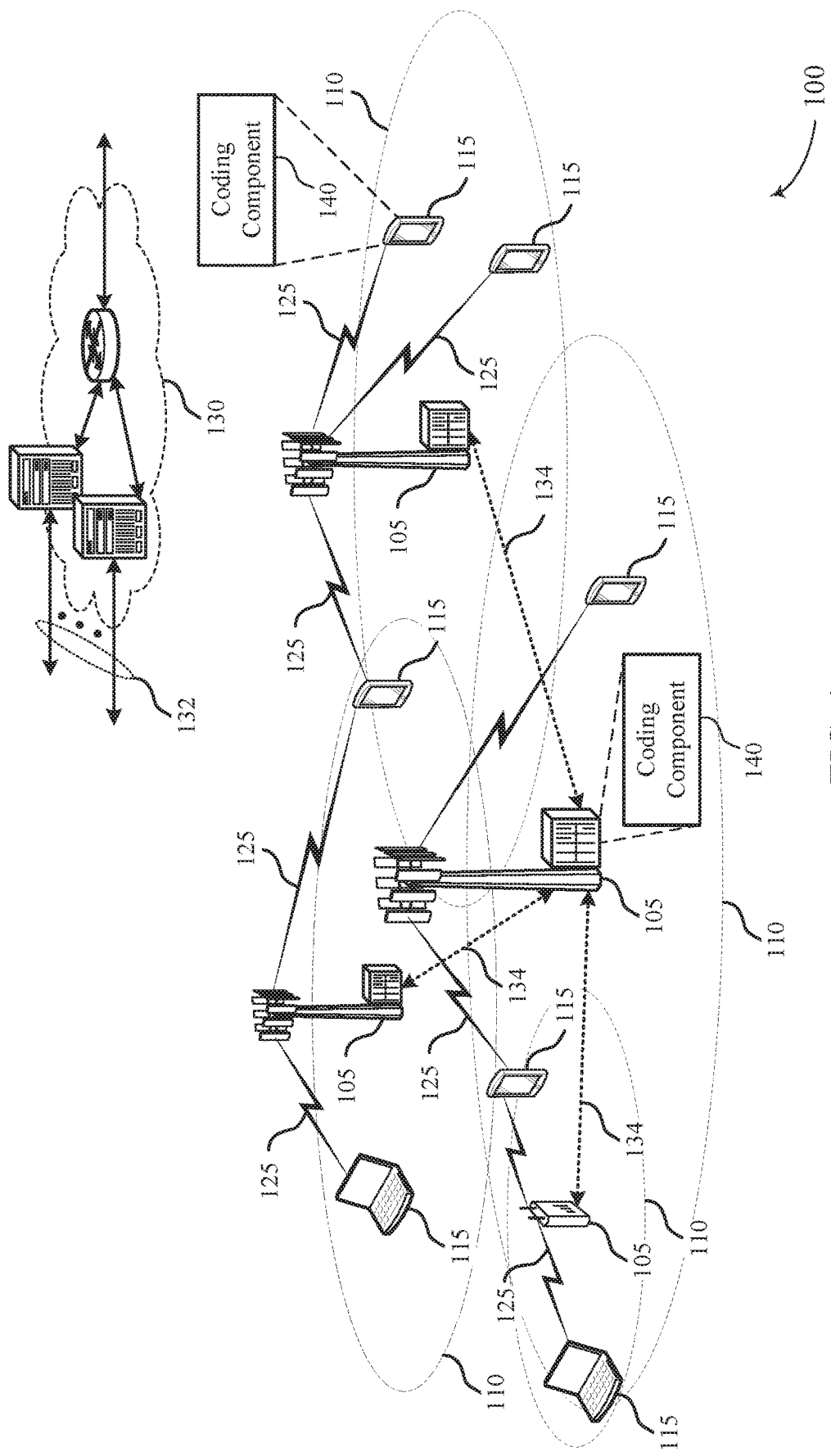
FIG. 1 illustrates an example of a system for encoding by an encoder and/or decoding by a decoder that supports bit allocation for encoding and/or decoding in accordance with aspects of the present disclosure.

An encoder may include multiple channel instances (e.g, encoding branches) that are each loaded with a bit to be encoded. For example, an information vector (e.g., including information and non-information (e.g., redundant or frozen bits) may be loaded or allocated into one or more channel instances of a channel of an encoder (e.g., before or after a Hadamard transform for a polar code). Each channel instance may be associated with a reliability metric that may relate to, for example, a capacity, a reliability, an information rate, etc. The reliability metric may indicate the likelihood that a bit loaded into a given channel instance for transmission will be successfully decoded at a receiver. Thus, to improve the probability of successful decoding, a proportional number of information bits within an information vector are loaded into channel instances (e.g., after multiple stages of channel polarization) associated with favorable (e.g., high) reliability metrics, while a proportional number of information bits are loaded in channel instances associated with lower reliability metrics. That is, information bits may be distributed across channel instances of the encoder based on respective reliability metrics of the channel instances. During decoding, a decoder may receive encoded information bits (and non-information bits) in a codeword. In some cases, the decoder may also rely on reliability metrics for properly decoding one or more portions of the codeword and obtaining a decoded output that includes the information bits.

For example, a polar code encoder uses multiple recursive concatenation of a short kernel code in order to encode information bits. In polar coding, when the number of recursions becomes large, the resulting channel instances tend to either have high reliability or low reliability (an example of polarization). Therefore, additional information bits are generally loaded into channel instances having favorable (e.g., high) reliability metrics. Additional frozen information bits are generally loaded into channel instances having less favorable (e.g., low) reliability metrics.

Determining the location and distribution of information bits may improve polar code design. Reliability metrics may be generated for each bit on each channel instance, and techniques may be used to sort and select the top most reliable bits in a channel instance as information bits.

In some examples of an improved polar code construction, a channel of an encoder and/or decoder may be partitioned (e.g., polarized) or grouped into sectors or groups such that each group includes one or more channel instances (for at least one iteration). The partitioning (e.g., polarizing) or grouping may be performed based on or according to a recursion formula that may be based on a length of a base sequence, for example. Thereafter, the encoder or decoder may determine a number of information bits (e.g., of a total number of information bits of an information vector for encoding) to be allocated (during encoding) to each group based on a rate associated with each group. During decoding, a decoder may assign a determined number of information bits to one or more groups based on an information bit rate associated with each group.

In an encoding operation, following the determination of the number of information bits, the information bits of the information vector may be loaded into various channel instances of one or more groups. In determining which channel instance to load a given information bit, the encoder may compare a size of a group and the associated number of information bits to the allocated to that group with a base sequence indicating the locations for information bits within the group. One or more base sequences may be used or stored by the encoder and each base sequence may be associated with a code length (N) and dimension (k) corresponding to the number of information bits to be allocated in a given code of length N to determine the information bit allocation in that group. The base sequence may also be determined based on a group location within the partitioned information vector. Once information bits are assigned to the channel instances, the encoder may encode the information vector including the information bits using the channel instances and based on the assigned information bits.

In a decoding operation, the decoder may assign a bit type (e.g., information bit, parity bit, frozen bit, etc.) to one or more channel instances of a channel of the decoder. The decoder may then use the assigned bit types to determine the bits of the codeword that are information bits and decode the codeword accordingly to obtain the information bits. One or more channel instances associated with frozen bits may be known by the encoder and/or provided to the decoder.

Aspects of the disclosure are initially described in the context of a wireless communications system. Aspects of the disclosure are further illustrated by and described with reference to apparatus diagrams, system diagrams, and flowcharts that relate to bit allocation for encoding and decoding, FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a long term evolution (LTE), LTE-Advanced (LTE-A), new radio (NM, or 5G network. In NR or 5G networks, the base stations 105 may include access nodes (ANs), central units (CUs), and/or distributed units (DUs). An may be an example of a new radio base station (NR BS), a new radio Node-B (NR NB), a network node (NN), or the like. A CU may be an example of a central node (CN), an access node controller (ANC), or the like. Each of the DUs may be an example of an edge node (EN), an edge unit (EU), a radio head (RH), a smart radio head (SRH), a transmission and reception point (FRP), or the like. The UEs 115, base stations 105, and other devices of wireless communications system 100 may have low-latency encoders that output codeword bits for transmission prior to loading all input bits. A UE 115, a base station 105, or both, may include, a coding component 140 (e.g., an encoder, decoder, etc.) as described below in further detail.

Base stations 105 may wirelessly communicate with UEs 115 via one or more base station antennas. Each base station 105 may provide communication coverage for a respective geographic coverage area 110. Communication links 125 shown in wireless communications system 100 may include uplink (UL) transmissions from a UE 115 to a base station 105, or downlink (DL) transmissions, from a base station 105 to a UE 115. UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of things (IoT) device, an Internet of Everything (IoE) device, a machine type communication (MTC) device, an appliance, an automobile, or the like.

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other LIE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication, M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines, Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

In some cases, wireless communications system 100 may utilize enhanced component carriers (eCCs). In some examples, NR or 5G networks may utilize eCCs, and the use of eCCs over a shared spectrum may be referred to as New Radio for Shared Spectrum (NR-SS). An SCell may, for instance, be an eCC. An eCC may be characterized by one or more features including: wider bandwidth, shorter symbol duration, shorter TTIs, and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power). In some cases, an eCC may utilize a different symbol duration than other CCs, which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like, A base station 105 may also be referred to as an access point (AP), a Node B, Radio Network Controller (RNC), evolved Node B (eNB), Base Station Controller (BSC), Base Transceiver Station (BT), Base Station (BS), Transceiver Function (TF), Radio Router, Radio Transceiver, Basic Service Set (BSS), Extended Service Set (ESS), Radio Base Station (RBS), or some other terminology.

A base station 105 may be connected by an S1 interface to the core network 130. The core network may be an evolved packet core (EPC), which may include at least one mobility management entity (MME), at least one serving gateway (S-GW), and at least one packet data network gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service (PSS).

The core network 130 may provide user authentication, access authorization, tracking, IP connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices radio heads and access network controllers) or consolidated into a single network device (e.g., a base station 105).

Wireless communications system 100 may operate in an ultra high frequency (UHF) frequency region using frequency bands from 700 MHz to 2600 MHz (2.6 GHz), although in some cases WLAN networks may use frequencies as high as 4 GHz. This region may also be known as the decimeter band, since the wavelengths range from approximately one decimeter to one meter in length, UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, ERF transmissions may be subject to even greater atmospheric attenuation and shorter range than UHF transmissions.

Wireless communications system 100 may support millimeter wave (mmW) communications between UES 115 and base stations 105. Devices operating in mmW or ELF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115), This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station) and a receiver (e.g., a UE), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARQ) to provide retransmission at the MAC layer to improve link efficiency. In the control plane, the Radio Resource Control (RRC) protocol layer may provide establishment, configuration, and maintenance of an RRC connection between a UE 115 and a network device 105-c, network device 105-b, or core network 130 supporting radio bearers for user plane data. At the Physical (PRY) layer, transport channels may be mapped to physical channels.

In some cases, wireless communications system 100 may utilize enhanced component carriers (eCCs). An eCC may be characterized by one or more features including: wider bandwidth, shorter symbol duration, shorter transmission time interval (TTIs), and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power).

In some cases, an eCC may utilize a different symbol duration than other CCs, which may include use of a reduced symbol duration as compared with symbol durations of the other CCs. A shorter symbol duration may be associated with increased subcarrier spacing. A ITT in an eCC may consist of one or multiple symbols. In some cases, the TTI duration (that is, the number of symbols in a ITT) may be variable. In some cases, an eCC may utilize a different symbol duration than other CCs, which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A ITT in eCC may consist of one or multiple symbols. In some cases, the TTI duration (that is, the number of symbols in a TTI) may be variable.

In some cases, wireless system 100 may utilize both licensed and unlicensed radio frequency spectrum bands. For example, wireless system 100 may employ UTE License Assisted Access (LTE-LAA) or LTE Unlicensed (LTE U) radio access technology or NR technology in an unlicensed band such as the 5 Ghz, Industrial. Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a carrier aggregation (CA) configuration in conjunction with component carriers (CCs) operating in a licensed band. Operations in unlicensed spectrum may include downlink transmissions, uplink transmissions, or both. Duplexing in unlicensed spectrum may be based on frequency division duplexing (FDD), time division duplexing (TDD) or a combination of both.

An encoder may have a finite input bus width or input bits of a single input vector may become available at different times. For example, an input vector may include information bits, check bits, frozen bits, etc. where some or all information bits may be generated by or received from different sources. For example, bits that are not allocated as information bits may be assigned as parity bits or frozen bits. Parity bits may be used in parity check (PC) polar coding techniques and frozen bits may be bits of a given value (0, 1, etc.) known to the both the encoder and decoder (e.g., the encoder encoding information bits at a transmitter and the decoder decoding the codeword received at a receiver). Construction of an input vector may depend on information bit location/distribution amongst the channel instances of the encoder. In some cases, different input vectors containing the same information bits (e.g., input vectors with a different allocation of information bits) may be received with different success rates. For example, an input vector with information bits distributed such that the information bits are loaded to channel instances associated with high reliability metrics may be decoded at an increased success rate. The input vector may be, for example, a physical channel message (e.g., control channel message) or a data packet.

System performance of transmission of information bits in low-latency environments may be determined by factors such as overhead, coding gain, transmission pipelining, and decoding delay. Some processing techniques may emphasize improving transmission pipelining and decoding delay at the expense of higher overhead and lower coding gain. Generally, use of a larger code length (e.g., larger codeword) provides higher coding gain. However, a larger code length result in a larger decoding delay and overall system latency. In contrast, smaller code length reduces latency and/or decoding delay, but may result in an increase in overhead and/or lower coding gain.

Components of the wireless communications system 100 including the base stations 105 or UEs 115 may implement encoding techniques that allocate information bits and output codeword bits for transmission. A base station 105 or a UE 115 may include an encoder (e.g., coding component 140) having multiple channel instances (e.g., encoding branches) that are each loaded with a bit to be encoded by dividing encoding branches into groups and allocating information bits within those groups based on techniques described herein. By encoding and outputting encoded bits in such a manner, an encoder as described herein may have less latency as compared to conventional encoders.

Components of the wireless communications system 100 including the base stations 105 or UEs 115 may implement decoding techniques that assign bit types to a codeword for use in a decoding operation. For example, a base station 105 or a LIE 115 may include a decoder (e.g., coding component 140) having multiple channel instances (e.g., decoding branches) that are assigned a bit type by dividing decoding branches into groups and assigning an information bit type to some decoding branches and other bit types to other decoding branches using on techniques described herein. By assigning bit types and decoding encoded bits in such a manner, a decoder as described herein may have less latency as compared to conventional decoder.

Figure 2:
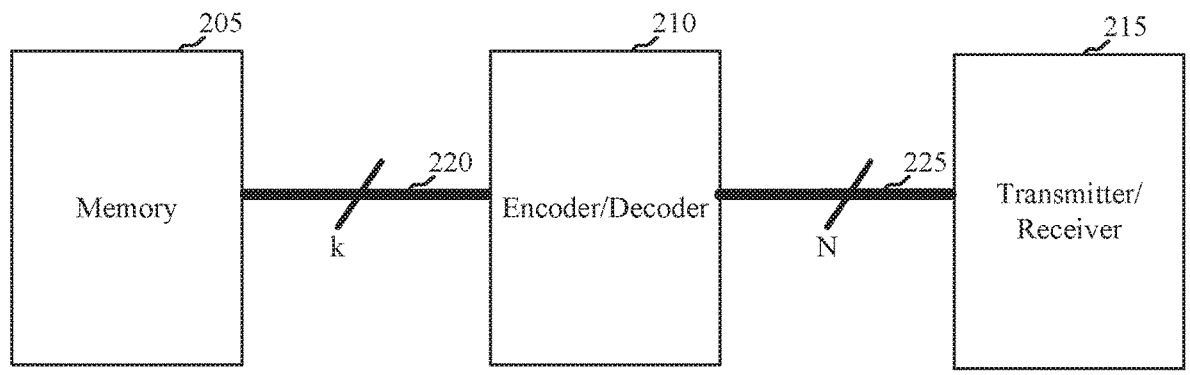
FIG. 2 illustrates an example of a device that supports bit allocation for encoding and/or decoding in accordance with aspects of the present disclosure.

FIG. 2 illustrates an example of a device 200 for bit allocation for encoding and decoding, in accordance with one or more aspects of the present disclosure. The device 200 may be any device within wireless communications system 100 that performs an encoding or decoding operation. The device 200 may be, for example, a UE 115 or base station 105 as described in FIG. 1. Further, the encoder/decoder 210 may be an example of the coding component 140 as described with reference to FIG. 1.

As shown, device 200 may include a memory 205, an encoder/decoder 210, and a transmitter/receiver 215. Bus 220 may connect memory 205 to encoder/decoder 210 and bus 225 may connect encoder/decoder 210 to transmitter/receiver 215. In some instances, device 200 may have data stored in memory 205 to be transmitted to another device, such as UE 115 or base station 105. To initiate the transmission process, the device 200 may retrieve from memory 205 the data for transmission. The data may include a number of information bits provided from memory 205 to encoder/decoder 210 via bus 220. The number of information bits may be represented as a value 'k,' as shown. The encoder/decoder 210 may encode the number of information bits and output a codeword having a length 'N,' which may be different than or the same as k. The bits that are not allocated as information bits (i.e., N–k bits) may be parity bits or frozen bits, Parity bits may be used in PC polar coding techniques and frozen bits may be bits of a given value (0, 1, etc.) known to the both the encoder and decoder (i.e., the encoder encoding information bits at a transmitter and the decoder decoding the codeword received at a receiver), In some examples, the allocation of information bits and parity bits (as opposed to frozen bits) may be considered together using the framework for non-frozen hit allocation described herein. Further, from the receiving device perspective, device 200 may receive encoded data (e.g., a codeword) via receiver 215, and decode the encoded data using decoder 210 to obtain the transmitted data.

In some examples, the method for encoding data transmissions by the encoder 210 may involve generating a polar code of length 'N' and dimension 'k' (corresponding to the number of information bits). A polar code is an example of a linear block error correcting code and is the first coding technique to provably achieve channel capacity and may be used to increase the probability of a successful transmission. During encoding, an encoder may include multiple channel instances (e.g, encoding branches) that are each loaded with a bit to be encoded. Bits to be encoded may include information bits and non-information bits. In other examples, bits to be encoded may include non-frozen bits but not frozen bits. Reliability metrics may be calculated based on bit locations (e.g., channel instances) of the encoder/decoder 210. For example, the probability that a given bit location (or group of bits) will be successfully decoded may be calculated. This probability may be referred to as a reliability and may be associated with the given bit location or channel instance (or a group of bit or channel locations). In some cases, the channel instances may be sorted based on the determined reliability metrics (e.g., in order of decreasing or increasing reliability) and all or a portion of the channel instances will be assigned a given bit type (e.g., parity bit, information bit, frozen bit). For a given dimension k value, the k most reliable bit locations are assigned as information bits and the remaining bits may be frozen bits or parity bits. In some other examples, k+p bits may be information plus parity bits, and the remaining N−(k+p) bits may be frozen bits.

Such implementations may be complex, and may introduce latency into the encoding or decoding process. For example, a decoder may perform a blind decoding operation on a control channel where multiple hypotheses of the code length N and dimension k are tested using the decoder. For each hypothesis of different N, the decoder must recalculate and resort the reliability metrics to determine the information bit locations, frozen bit locations, and or parity bit locations. Sorting the reliability metrics may take a substantial amount of processing and processing time may impact latency of encoding or decoding for large values of N. Alternatively, the device may store a complete sorted list of bit locations for 511 code lengths N. However, the amount of storage resources used may increase substantially as the number of values of N supported by the encoder or decoder increase.

According to some aspects, channel instances of encoder/decoder 210 may be partitioned into sectors or groups such that each group includes one or more channel instances. The partition may be performed according to a recursion formula that may be based on a length of a base sequence, for example. In the context of polar codes, the channel instances may be partitioned into sectors or groups by recursively polarizing the channel instances into sectors or groups. Thereafter, the encoder 210 may determine a number of information bits (e.g., of a total number of information bits of an information vector for encoding) to be allocated or distributed to each group based on a ratio associated with each group. Such techniques may reduce storage and/or processing/calculation demands at a decoder 210. For example, fewer hypotheses of code length N and dimension k for a blind decoding operation on a control channel may be tested, and because only sequences of a given length (e.g., length of the base sequence) are stored, storage of lists of bit locations/channel instances for all code lengths N may be reduced or avoided. In some examples, coding performance may be improved by incorporating channel reliability information such as, e.g., puncturing/shortening/repetition and bit modulation mapping.

The total number of channel instances of the encoder 210 may be recursively divided into sectors or groups as discussed below with reference to FIG. 5. Each group of channel instances may be allocated a number of information bits based on, for example, the total number of information bits, the polarization of the channel, etc. number of information bits allocated to each group may depend on, for example, reliability metric(s) and the number of channel instances in the group (e.g., the size of the group). For example, a total number of information bits may be distributed across multiple groups and the channel instances to which the information bits are allocated may be based on a base sequence of a given length. In one example, the given length of the base sequence may be 64 and a single base sequence of length 64 may be stored. In aspects, the length of such base sequence may be less than the block length or size. Additionally or alternatively, multiple base sequences of the same length or of varying lengths (e.g., 32, 64, 50, 120, 128, etc.) may be stored. In some examples, a group may not have a length corresponding to an integer power of 2 due to puncturing and shortening operations.

Following the determination of the number of information bits to be allocated to each group, the information bits of the information vector may be loaded into various channel instances of one or more groups. In determining which channel instance to load a given information bit, the encoder may compare a size of a group and the associated number of information bits to the allocated to that group with a base sequence indicating the locations for information bits within the group. As discussed above, one or more base sequences may be used or stored by the encoder/decoder 210. Additionally or alternatively, each base sequence may be associated with a code length (N) and dimension (k) corresponding to the number of information bits to be allocated in a given code of length N. The base sequence may also be determined based on a group location within the partitioned information vector. Once information bits are assigned to the channel instances, the encoder may encode the information vector including the information bits using the channel instances and based on the assigned information bits. In some examples, the information bit loaded to a channel instance may be impacted based at least in part on a puncturing and/or shortening operation. For example, u domain bit locations corresponding to punctured or shortened bit locations in x domain may be fixed to ricin-information bits (or frozen bits).

The techniques described herein may enable a scalable and improved and/or optimal way to extend one or more base sequences (e.g., having a length less than a block length) to sequences or channel instances of arbitrary length. In some cases, rather than storing sequences for each N and k combination, only base sequence(s) of a given length may be stored and the information vector may be recursively partitioned into groups until the group size reaches the size of the base sequence. As a result, less storage space may be utilized because the entire sequence of bit locations and associated bit types is not stored. Techniques may be scalable to different block lengths, aggregation levels for control channels, etc. Further, polar codes for different channel requirements may be designed without running numerical density evolution every time. For example, a mixed binary erasure channel (BEC) and Additive white Gaussian noise (AWGN) channel curve (e.g., linear interpolated curve of the BEC and AWGN curves) may be used to design for mixed Gaussian and erasure channel. In some examples, channel instances before polarization that are punctured and/or shortened may be modelled as going through a BEC channel while the channel instances transmitted through a channel may be modelled as going through an AWGN channel. Applications may extend to design general linear block/convolutional/LDPC code concatenation. Such schemes may be used to determine the code rate of component code.

Encoder/decoder 210 may use a number of encoding techniques to encode the data for transmission such as linear block encoding, polar encoding, Reed-Muller (RM) encoding, polar RM encoding, and the like, which may introduce redundancy into the encoded output. This redundancy may increase the overall probability that the number of information bits will be successfully decoded upon reception. The following initially describes an example of encoder 210 being a polar encoder with 8 channel instances (e.g., encoding branches), and later extends the principles herein to an encoder having any number of channel instances.

Figure 3:
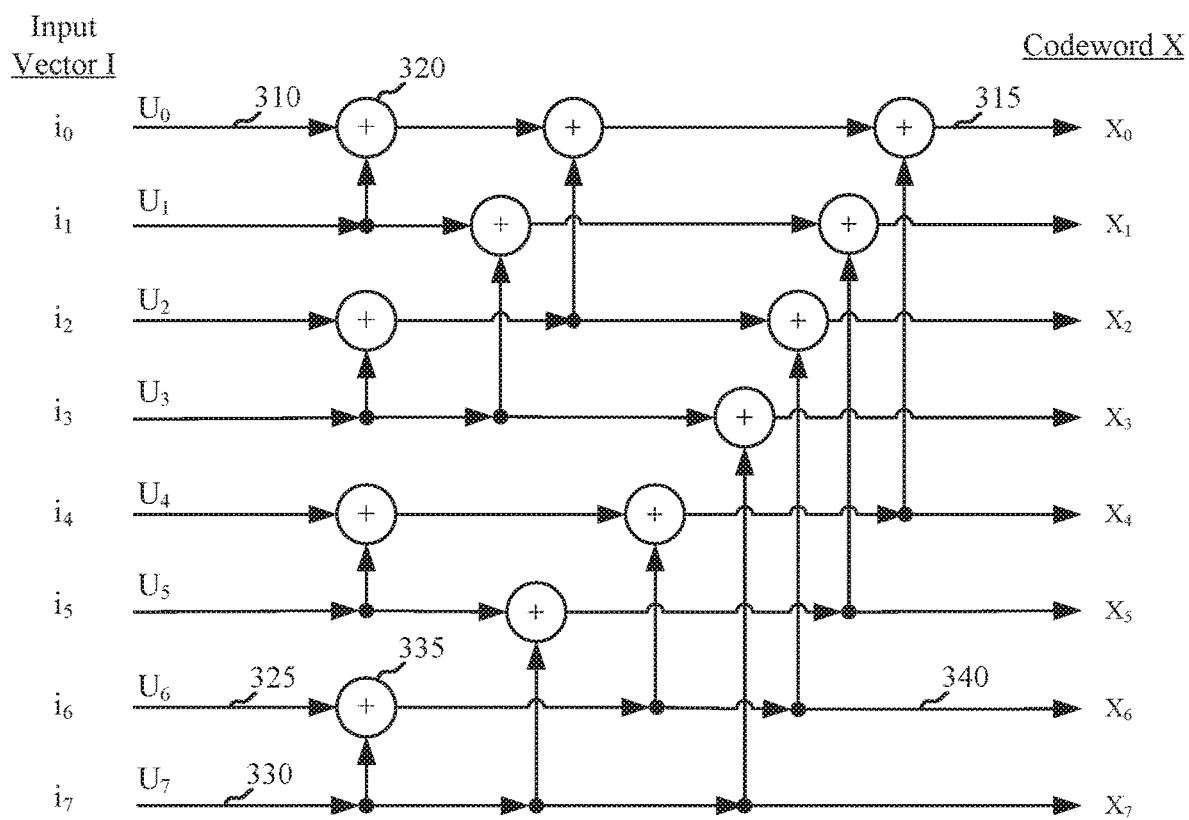
FIG. 3 illustrates an example of an encoder that supports bit allocation for encoding and/or decoding in accordance with aspects of the present disclosure.

FIG. 3 illustrates an example of an encoder 300 for bit allocation for encoding and/or decoding, in accordance with one or more aspects of the present disclosure. Encoder 300 may be an example of encoder/decoder 210 of FIG. 2. The following describes encoder 300 as being a polar encoder, and the principles described herein may be extended to other types of encoders such as, for example, an RM encoder, a polar RM encoder, a systematic encoder, a bit-reversed encoder, and the like.

In this example, polar encoder 300 may receive an input information vector I ($[i_0, i_1, \ldots, i_7]$) having a plurality of bits to be encoded, at least a portion of which may be information bits. In this example, encoder 300 is an 8-bit encoder, and therefore receives an input vector having a length N=8. Using this information, encoder 300 outputs an 8-bit output X ($[X_0, X_1, \ldots, X_7]$), Coders of other bit sizes may also be used and in some cases, the output codeword may have a different length than that of the input information vector.

As shown, encoder 300 includes multiple bit locations $U_0$ to $U_7$ that may be loaded with corresponding bits from the input vector I. In branch $U_0$, for example, bit $i_0$ is received at input 310, three Boolean exclusive or (XOR) operations are performed (represented by "+" symbol at element 320), and bit $X_0$ of output X is output at 315.

As depicted, each channel instance $U_0$ to $U_7$ of polar encoder 300 may perform zero or more encoding operations on the input bits, Encoding a hit in one channel instance may depend on bits input to one or more other channel instances. For example, branch $U_6$ encodes bit $i_0$ by XOR'ing bits $i_6$ and $i_7$ (e.g., $X_6=i_6$ XOR $i_7$). As seen, bit $i_6$ is received at input 325 of channel instance $U_6$ and bit $i_7$ is received at input 330 of branch $U_7$. At 335, channel instance $U_6$ XORs $i_6$ and $i_7$ and provides $X_6$ at output 340. The remaining channel instances $U_0$ to $U_7$ perform similar operations to encode corresponding bits of the input vector I.

In some cases, the channel instances $W_N$ (e.g., $W_0$-$W_7$) corresponding to bits $U_0$ to $U_7$ may each have an associated reliability metric. Thus, the information bits assigned bit locations $U_0$ to $U_7$ may have varying probabilities of successful decoding once output X is transmitted and received at a receiver. In such cases, the input bits input to the 'k' most reliable channel instances may be assigned an information bit type.

Figure 4:
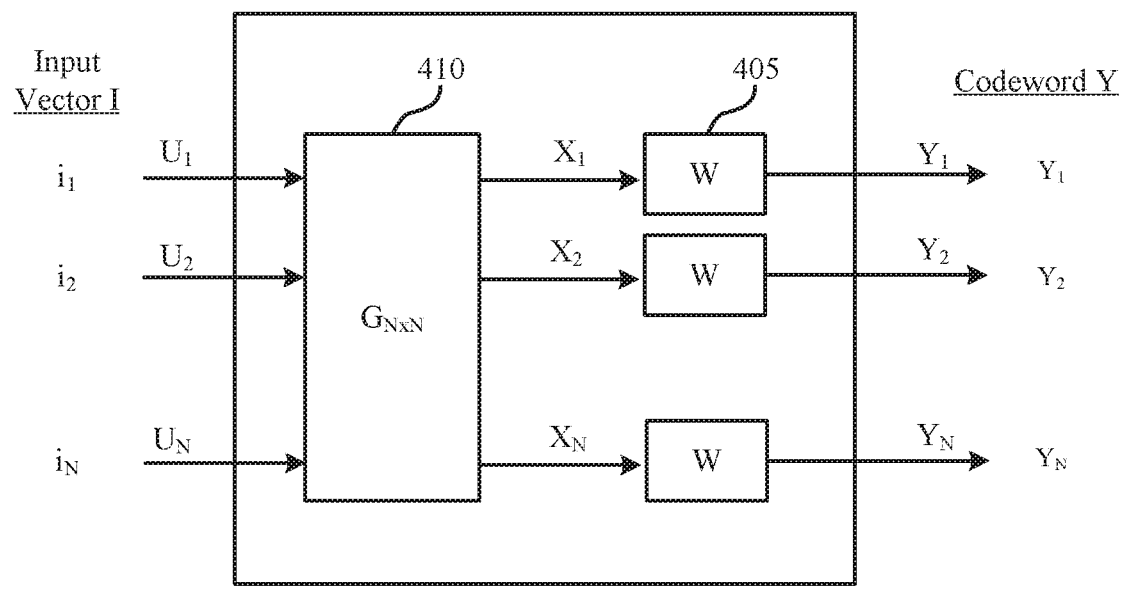
FIG. 4 illustrates an example of an encoder that supports bit allocation for encoding and/or decoding in accordance with aspects of the present disclosure.

FIG. 4 illustrates an example of an encoder 400 for bit allocation for encoding and decoding, in accordance with one or more aspects of the present disclosure. Encoder 400 may be an example of coding component 140, encoder/decoder 210, and/or encoder 300 with reference to FIGS. 1-3. The following describes encoder 400 as being a polar encoder, and the principles described herein may be extended to other types of encoders such as, for example, an RM encoder, a polar RM encoder, a systematic encoder, a bit-reversed encoder, and the like.

A channel 405 (e.g., W) may be a binary-input discrete memoryless channel (e.g., W:X→Y). The capacity of the channel may be represented by C=I(X; Y) and for the example of binary-input, 1≤C≤1, where C=1(X; Y) denotes mutual information. In some examples, the capacity of each channel instance may not be the same. For example, for binary input channels, channel of punctured bits may have C=0, channels of shortened bits may have c=1, and channels transmitted over a given A WGN channel may have a C of the corresponding channel. There may be N copies of channel 405 (e.g., channel W) and there may be a one-to-one mapping from U to X as illustrated in FIG. 4 (e.g., $G_{N \times N}$: $\{0, 1\}^N \rightarrow \{0, 1\}^N$). Therefore, a resulting effective channel, $W_{vec}$ may be created (e.g., an $X^N = U^N \cdot G_{N \times N}$).

Figure 5:
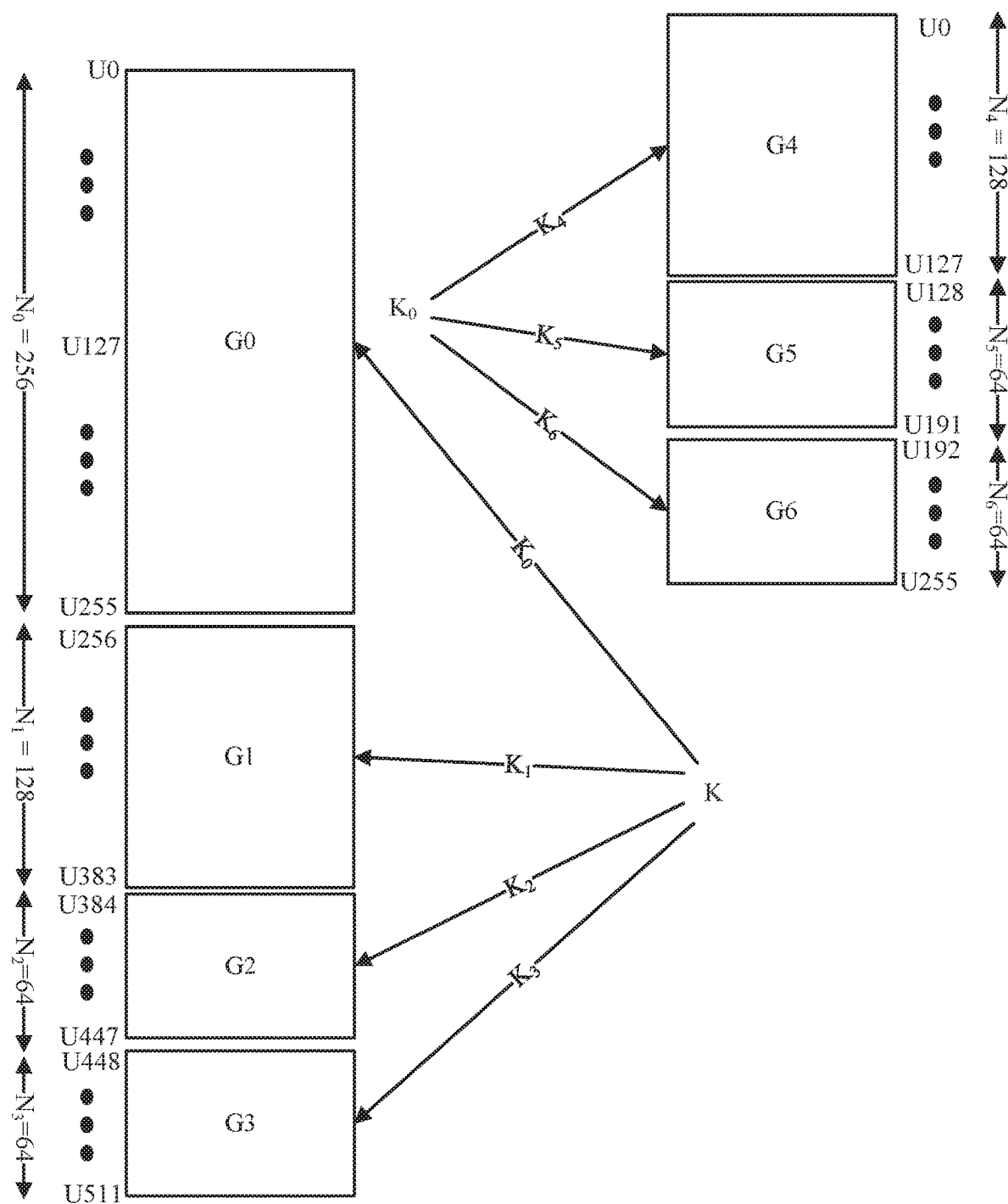
FIG. 5 illustrates an example of an encoder that supports bit allocation for encoding and/or decoding in accordance with aspects of the present disclosure.

FIG. 5 illustrates an example of an encoder 500 for bit allocation for encoding and decoding, in accordance with one or more aspects of the present disclosure. Encoder 500 may be an example of coding component 140, encoder/decoder 210, encoder 300, and/or encoder 400 with reference to FIGS. 1-4. The following describes encoder 500 as being a polar encoder, and the principles described herein may be extended to other types of encoders such as, for example, an RM encoder, a polar RM encoder, a systematic encoder, a bit-reversed encoder, and the like.

In this example, polar encoder 500 may receive an input information vector having a plurality of bits to be encoded, at least a portion of which may be information bits. In this example, encoder 500 is an 512-bit encoder, and therefore may receive an input vector having a length up to N=512 and the number of information bits up to k=512. In aspects, the block length may be 512, Using this information, encoder 500 may output a 512-bit codeword. Coders of other bit sizes may also be used and in some cases, the output codeword may have a different length than that of the input information vector.

As shown, encoder 500 includes multiple bit locations U0 to U511 that may be loaded with corresponding hits from the input vector (e.g., as in the example of FIG. 3), Encoder 500 may utilize multiple groups of channel instances for bit allocation techniques described herein. As described above with reference to FIG. 2, a short or reduced base sequence (e.g., a base sequence having a length less than the block length) may be used to determine information bit location reduced groups of channel instances. For example, channel instances of encoder 500 may be divided into two or more groups of channel instances (G), and information bits (k) may be allocated to each group (k0, k1, k2 . . . etc.). The information bits allocated to each group (k0, k1, k2 . . . , etc.) may then be distributed or allocated amongst a reduced number of channel instances within each group according to reliability metrics as discussed above. Such techniques may reduce storage and/or computations otherwise associated with encoding operations utilizing larger ranges of channel instances and information bits as also described above. Also, described techniques may facilitate code design to be more suited for different types of channels, e.g., by providing improved coding performance by better incorporating channel information such as puncturing/shortening/repetition in the information bit allocation.

The present example utilizes a base sequence of length 64 (e.g., $N_{ref}$=64). The 512 channel instances (corresponding to U0 to U511) may be divided into two or more groups based on the utilized base sequence (e.g., $N_{ref}$=64). For example, channel instances corresponding to U0 to U511 may be divided into 4 groups (G0, G1, G2, and G3). The smallest size (e.g., number of channel instances) of any group may depend on the length of the base sequence used (e.g., N3=N2=$N_{ref}$=64). The number of information bits allocated to each group of channel instances may then be determined by a reliability formula described below with reference to FIG. 6. For example, channel instances corresponding to U0 to U511 may be divided into G0 of length N0=256 with an allocation of k0 information bits, G1 of length N1=128 with an allocation of kl information bits, G2 of length N2=64 with an allocation of k2 information bits, and G3 of length N3=64 with an allocation of k3 information bits. The information hits allocated to each group may equal the total number of bits to be encoded (e.g., k=k0+k1+k2+k3). For the present example, encoder 500 may use storage and/or perform computations associated with N0, N1, N2, N3. In combination with k0, k1, k2, and k3 values, information allocation of the overall polar codeword may be determined as described above. In aspects, information bits may be allocated based on mutual information (e.g., based on a mutual information transfer chart) and/or by leveraging the reliability ordering invariant property.

In other examples, groups of lengths larger than the base sequence may be further reduced into additional groups down to the base sequence length. That is, group G0 of length N0=256 may be reduced to groups G4 of length N4=128, G5 of length N5=64, and G6 of length N6=64. Here, the information bits allocated to group G0 (e.g., k0) may further be distributed to groups G4, G5, and G6 (e.g., k0=k4+k5+k6). By extension, group G4 and G1 may each be reduced one additional time to each reduce to two more groups of length 64 (e.g., because $N_{ref}$=64), and encoder 500 may use storage and/or perform computations associated with N=64, and k0, k1, k2 . . . etc. values as described above. That is, in examples where channel instances of encoder 500 are reduced to groups equal to the base sequence length (e.g., all N=$N_{ref}$=64), encoder 500 may only need to perform encoding operations associated with the base sequence length and the maximum allocation of k (e.g., either k0 or k1 or k2, and so on). In some examples, one base sequence of length 64 may be used to deter mine locations for information bits within each of groups G0 through G6. In some examples, further recursions may be performed on some groups to get even smaller lengths. Additionally or alternatively, multiple base sequences may represent locations for the same length 64 but of varying k values and/or in different locations. For instance, a base sequence of length 64 may correspond to k3 and a second base sequence of length 64 may correspond to k6, where k3 and k6 are different, or different base sequences may be designed for different groups ($G_i$).

Figure 6:
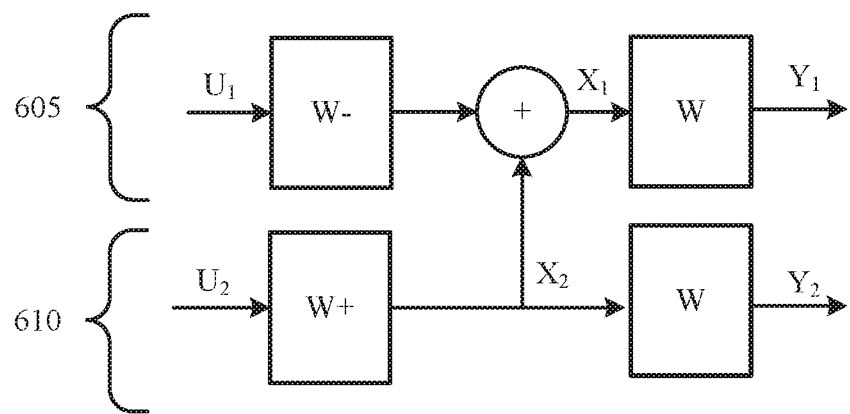
FIG. 6 illustrates an example of an encoder that supports bit allocation for encoding and/or decoding in accordance with aspects of the present disclosure.

FIG. 6 illustrates an example of an encoder 600 for bit allocation for encoding and decoding, in accordance with one or more aspects of the present disclosure. Encoder 600 may be an example of coding component 140, encoder/decoder 210, encoder 300, encoder 400, and/or encoder 500 with reference to FIGS. 1-5. In some cases, groups G0 and G1 of the present example may refer to groups G2 and G3 of the example in FIG. 5. The following describes encoder 600 as being a polar encoder, and the principles described herein may be extended to other types of encoders such as, for example, an RM encoder, a polar RM encoder, a systematic encoder, a bit-reversed encoder, and the like.

Channel polarization may be used to create an auxiliary channel to achieve coding gain beyond repetition. In the example of FIG. 6, N=2 and $$G_{2\times 2} = \begin{bmatrix} 1 & 0 \\ 1 & 1 \end{bmatrix}.$$

For example, if W is a BEC with an erasure probability, ε, the following may be deduced, $U_1=X_1 \oplus X_2=Y_1 \oplus Y_2$ and $U_2=X_2=X_1 \oplus U_1$ (e.g., parity-check repetition). For channel $W_1: U_1 \rightarrow Y^N$, the erasure probability may be represented as, $\varepsilon^-=1-(1-\varepsilon)^2=2\varepsilon-\varepsilon^2$). For channel $W_2: U_2 \rightarrow (Y^N, U_1)$, the erasure probability may be represented as, $\varepsilon^+=\varepsilon^2$. As such, $W_2$ may be considered a better channel than $W_1$ (e.g., $W_2$ may be decoded with a higher success rate) or $W^+=W_2$ and $W^-=W_1$. The above operation may be performed recursively, yielding more polarization across N channel instances.

The present example illustrates how information bits may be allocated (e.g., how k may be split into k0, k1, k2, k3, etc. with reference to FIG. 5). The lower portion of FIG. 6 illustrates channel polarization. For each polar code, and information rate (e.g., information rate=k/N) may be used as a mutual information input (e.g., to channel instances corresponding to U1 and U2). The mutual information output (e.g., y0 and y1) may polarize based on the functions associated with the encoder. For example, upper part 605 may correspond to the channel after XOR operation (e.g., $W^-$) and the lower part 610 may correspond to the channel after repetition (e.g., $W^+$). A mutual information transfer chart and/or the like may then be used to establish the relationship between W and $W^+/W^-$, and thus establish the polarization of the channel. In some examples, W for a channel group X1→Y1 and X2→Y2 may or may not be the same, and each channel instance of Xi→Yi may or may not be the same. The mutual information output of upper part 605, R0, and the mutual information output of the lower part, R1, may be used to derive information bit distribution. For example, $$k0 = k_- = k_{upper} = R0 * \left(\frac{N}{2}\right), \quad (1)$$
$$k1 = k_+ = \text{k\_lower} = R1 * (N/2)$$

Additionally or alternatively, they may be represented as a function of k information bits of the overall code as k0=k . . . =R0/R*k/2, k/1=$k_+$=R1/R*k/2. Such equations establish the information bit allocation relationship for each stage of polarization and they may be applied recursively to get number of information bits to a finer granularity.

For code lengths that are not to the power of 2 (e.g., race matching aspects, etc.) the distribution of information bits may be computed as before. For all (N, k) code, N=N0+N1+ . . . and k0, k1 . . . may be derived. For downlink control channels of different aggregation levels, the code length N may naturally grow with a power of 2 scaling. Rate matching may be done at aggregation level 1, every time, and further polarize with N0*2^M. The upper part of an extended graph of channel instance may likely be sparse (e.g., of information bits) and sequence (e.g., base sequence) of short length may be sufficient for the purpose of physical downlink control channel (PDCCH). Different groups of channel instances may potentially use different sequences for performance/complexity enhancements.

Figure 7:
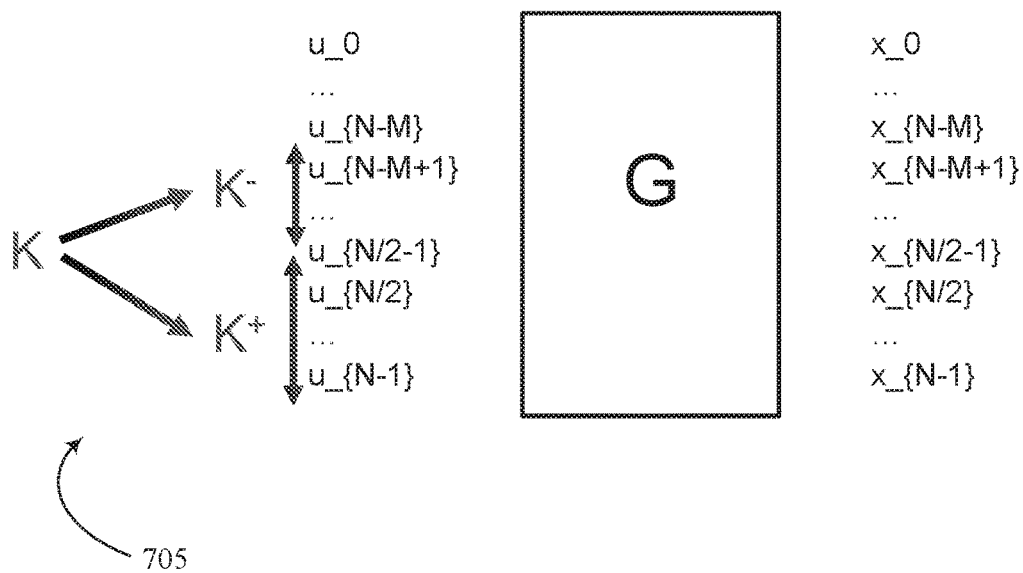
FIG. 7 illustrates examples of an information bit allocation for polar codes, in accordance with one or more aspects of the present disclosure.
Figure 7:
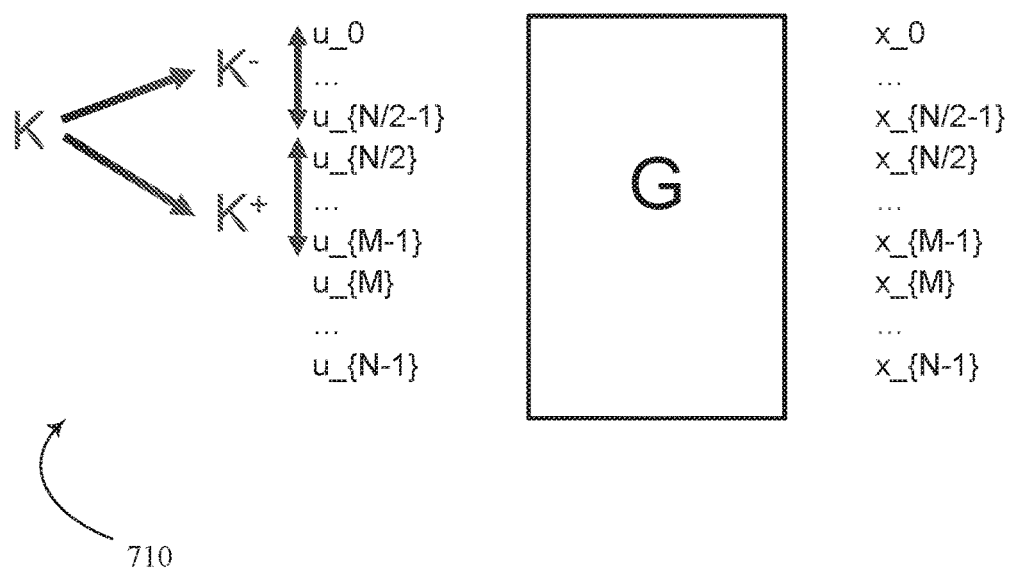

FIG. 7 illustrates examples of an information bit allocation 700 for polar codes, in accordance with one or more aspects of the present disclosure. Information bit allocation 700 shows a first information bit allocation 705 for a polar code with punctured bits and a second information bit allocation 710 for a polar code with shortened bits.

In some examples, when at least some channel instances, the information bit allocation 700 may take into account the puncturing/shortening based, e.g., on equation (1). For example, when {N−M} bits are punctured, as shown in bit allocation 705, the corresponding information bit allocation for W− and W+ channel may be simplified as:

$$K^- = [R_0(R) \times J]$$

-continued $$K^+ = K - K^-$$
$$R = \frac{K}{M} (E1)$$

where J is the non-punctured bits shown in the upper portion of bit allocation 705.

In some other examples, when {N−M} bits are shortened, as shown in bit allocation 710, the corresponding information bit allocation for W− and W+ channel can be simplified as:

$$K^+ = \lceil R_1(R) \times J \rceil$$
$$K^+ = K - K^-$$
$$R = \frac{K}{M} (E1)$$

where J is the non-shortened bits in the lower portion of bit allocation 710.

For an AWGN channel in the non-punctured/non-shortened, R0 and R1 may be further approximated using a formula as follows:

$$R_0(R) = R^2 + \left(-\frac{\left|R - \frac{1}{2}\right|}{32} + \frac{1}{64}\right)$$
$$J = M - \frac{N}{2}$$

For an AWGN channel in the non-punctured/non-shortened, R0 and R1 may be further approximated using a formula as follows:

$$R_1(R) = 2R - R^2 - \left(-\frac{\left|R - \frac{1}{2}\right|}{32} + \frac{1}{64}\right)$$
$$J = M - \frac{N}{2}$$

Figure 8:
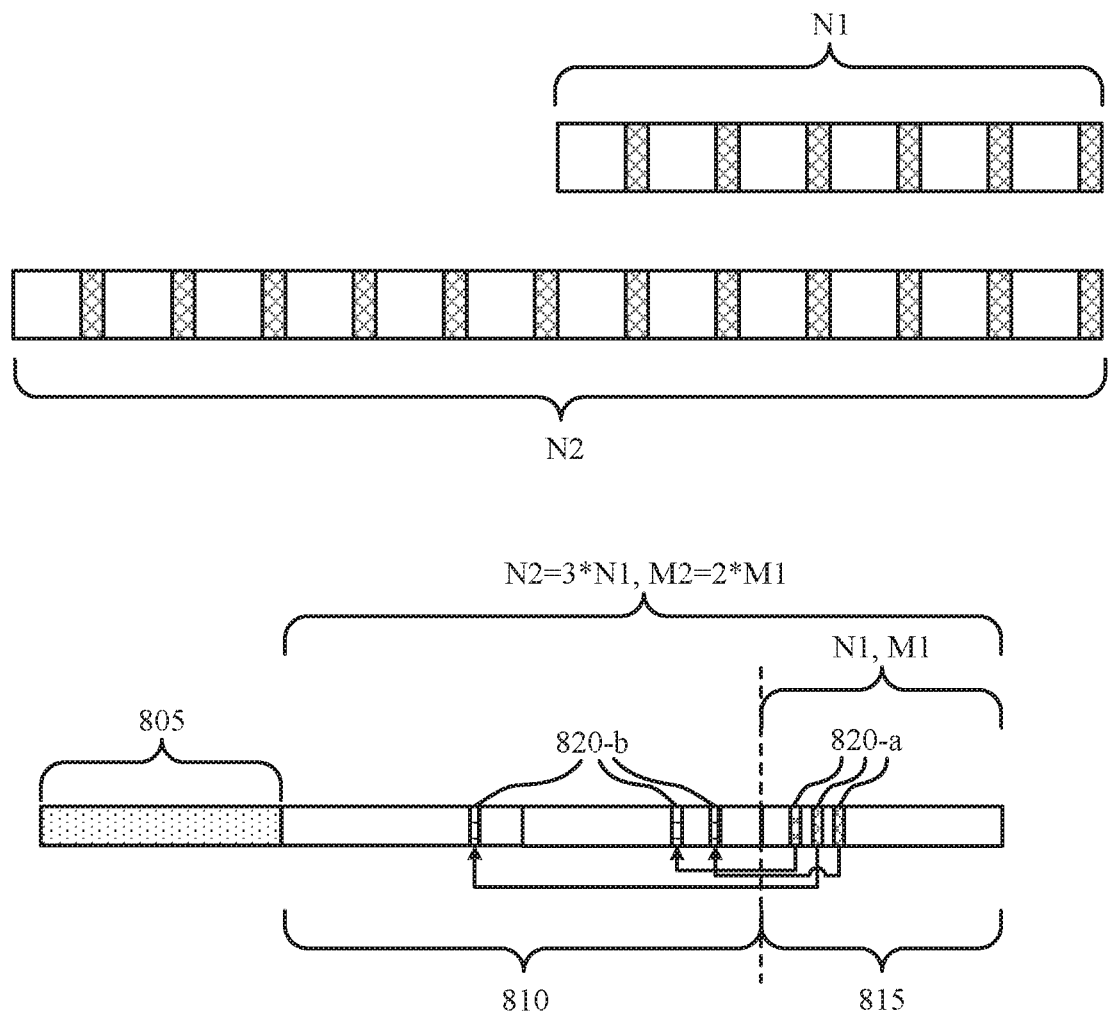
FIG. 8 illustrates an example of an incremental redundancy hybrid automatic repeat request (IR-HARQ) scheme that supports bit allocation for encoding and/or decoding in accordance with aspects of the present disclosure.

FIG. 8 illustrates an example of an incremental redundancy-hybrid automatic repeat request (IR-HARQ) scheme 800 for bit allocation for encoding and decoding, in accordance with one or more aspects of the present disclosure. In some cases, a polar code may be transmitted in an IR-HARQ scheme that utilizes techniques described herein. For example, a first transmission 815 (e.g., TX1) may be sent such that N1 bits are received at a receiver, Next, after an unsuccessful transmission for example, a second transmission 810 (e.g., TX2) may be transmitted with a total of N2 bits, which may be different than or the same as N1. In some cases, second transmission 810 may be referred to as a retransmission of first transmission 815 and may occur after receipt of a negative acknowledgement (HACK) message transmitter by the intended receiving device. In some examples, the IR-HARQ scheme may also include a punctured region 805. The following description relates to the allocation of information bits in IR-HARQ applications (e.g., the allocation of information bits from bit locations 820-a of a first transmission 815 to bit locations 820-b of a second transmission 810).

Each transmission may be viewed as a punctured version of a long code, or as an extended version of a short code, Recursive schemes discussed herein may be used to determine the allocation of information bits to each transmission (e.g., first transmission 815 and second transmission 810). As an example, first transmission 815 may allocate k information bits over some base sequence $N_{ref}$, and second transmission 810 may allocate the same k information bits over, for example, $2*N_{ref}$. By extension, additional retransmissions may allocate the k information bits over $3*N_{ref}$, $4*N_{ref}$, and so on. That is, information bit allocation for each transmission of IR-HARQ may follow recursive schemes described herein, in other examples, first transmission 815 may utilize N1=64 bits and second transmission 810 may utilize N2=N1+2*$N_{ref}$=64+128=192 bits. In yet other examples, first transmission 815 may utilize N1=128 bits and second transmission 810 may utilize N2=N1+$N_{ref}$=128+64=192 bits as an example of $N_{ref}$=64.

In the present example, information bits of first transmission 815 may be copied to more reliable bit locations in second transmission 810. That is, information bits (e.g., k=3) may be copied from bit locations 820-a to bit locations 820-b in the longer mother code after an IR-HARQ retransmission (which may be considered punctured coded bits in the a first IR-HARQ retransmission), and bit locations 820-b may be more reliable (e.g., received more successfully) than bit locations 820-a (e.g., after additional IR-HARQ transmission(s) are received, which may be due to the longer overall code length)due to increased encoded sequences associated with the second transmission 810 (e.g., more reliable bit locations 820 exist due to N2>N1).

In some examples, the number of coded bits in each transmission may vary with arbitrary granularity (e.g., not necessarily of length of integer power 2). For example, for a given payload k, a first transmission may include M1 bits out of a total of N bits, where (N−M1) bits may be considered as punctured. In this example, an input channel of a rate derived from an overall rate R1=k/M1 after the first transmission may be used to determine the k information location among the M1 bits in the u domain, where the set of k locations is defined as set S1.

A second transmission may include M2 bits out of a total of N bits, where (N−(M1+M2)) bits may be considered as punctured. In this example, an input channel of a rate derived from an overall rate R=k/(M1+M2) after the second transmission may be used to determine the information location among the total of (M1+M2) bits in the u domain, where the set of k locations is defined as set S2.

In some examples, S1 and S2 may not completely overlap (e.g., due to a reliability change from IR-HARQ transmissions), In such examples, some information bit locations in S2 may not be in S1. For example, the IR-HARQ scheme 800 shows that some of the information bits in S2 (but not in S1) may be more reliable that the bits in S1 (but not in S2) after an IR-HARQ retransmission is received. In such examples, the information bits may be copied from the bit locations in S2 but not in S1 to the bit locations in S1 but not in S2 during polar encoding, such that the overall polar codeword may be consistent across IR-HARQ transmissions.

For the decoder side, SC or SCL decoding may be employed to perform decoding in a sequential manner. The unpunctured part of the overall codeword may be decoded sequentially with the retransmission portion of the overall coded bits decoded first. Once some of the decisions on the information bit are determined (e.g., bits 820-b), their decisions may be used in the decoding when decoding the corresponding bits 820-*a* in the previous transmissions. The same recursion may be applied to an arbitrary number of IR-HARQ transmissions.

In some cases, IR-HARQ techniques may utilize puncturing. That is, a portion of the N generated bits may be punctured to reduce the code rate. Referring to the example of FIG. 5, if N=256 bits, 64 bits may be punctured and only 192 bits may be transmitted. In this example the upper part of the graph (e.g., associated with less reliable channel instances) may be punctured, such that group G0 is effectively gone and G1 may transmit only 64 bits. In such a puncturing scheme, the puncturing may be taken into account for the mutual information calculation (e.g., through recursion). Therefore, puncturing can be handled with finer levels of granularity through recursion as discussed below. In cases where M2=M1 and/or when M2!=M1 and puncturing is needed, puncturing may start from the top of the U domain (corresponding to channel instances domain), however, the scheme may apply in general. In some examples, puncturing can be performed at the bottom of a graph where coded bits are perfectly known (also known as shortening) for polar codes.

Mutual information, which may represented in a chart or reference table, may be used to establish the relationship between W and W⁺/W⁻, and thus, may be applied recursively to obtain finer granularity of k values in each small group. For example, for a base sequence of $N_{ref}=64$ and N=256 bits, the channel may be recursively grouped into 4 groups of length $N_{ref}=N_0=N_1=N_2=N_3=64$. As such, the information bit distribution may be derived as, $$k_{--} = k_{00} = R00 * \left(\frac{N}{4}\right) = Cap(W--) * \left(\frac{N}{4}\right), \quad (2)$$

$$k_{-+} = k_{01} = R01 * \left(\frac{N}{4}\right) = Cap(W-+) * \left(\frac{N}{4}\right),$$

$$k_{+-} = k_{10} = R10 * \left(\frac{N}{4}\right) = Cap(W+-) * \left(\frac{N}{4}\right),$$

$$k_{++} = k_{11} = R11 * \left(\frac{N}{4}\right) = Cap(W++) * \left(\frac{N}{4}\right),$$

$$k = k_{00} + k_{01} + k_{10} + k_{11},$$

$$Cap(W) = \frac{Cap(W--) + Cap(W--) + Cap(W--) + Cap(W++)}{4}$$

Such recursion may also work in the presence of puncturing. Information allocation with puncturing may be applied recursively to obtain finer granularity of k values in each small group. In such cases, assuming a code block length of N before puncturing, information bit distribution may be derived as, $$k_{00} = 0, \quad (3)$$

$$k_{01} = R01 * \left(\frac{N}{4}\right) = Cap(W-) * \left(\frac{N}{4}\right),$$

$$k_{10} = R10 * \left(\frac{N}{4}\right) = Cap(W_{\pm(2rep)-}) * \left(\frac{N}{4}\right),$$

$$k_{11} = R11 * \left(\frac{N}{2}\right) = Cap(W_{+(3rep)}) * \left(\frac{N}{4}\right),$$

$$k = k_{00} + k_{01} + k_{10} + k_{11},$$

$$\left(\frac{3}{4}\right) * Cap(W) + \left(\frac{1}{4}\right) * 0 =$$

$$\frac{0 + Cap(W-) + Cap(W_{\pm(2rep)-}) + Cap(W_{+(3rep)})}{4}$$

Note that $k_{00}=0$ due to puncturing (e.g., as described above with reference to G1). Similar schemes may apply when a larger or smaller portion of the whole graph gets punctured.

Therefore, the recursion also may be applied in the presence of puncturing as described above and information bit allocation schemes may work for different lengths of N after puncturing. In the previously discussed example, for N=64 a direct lookup table of the $N_{ref}=64$ reference sequence may be used. For N=128, information bit allocation of k information bits may be determined based on equations (1). For N=256, information bit allocation of k information bits may be determined based on equations (2) or on the recursive operation of equation (1). For N=192, information bit allocation of k information bits may be determined based on equations (3) or the recursive operation of equation (1) taking punctured bits into account (such as the one in (E1) and (E2)).

Figure 9:
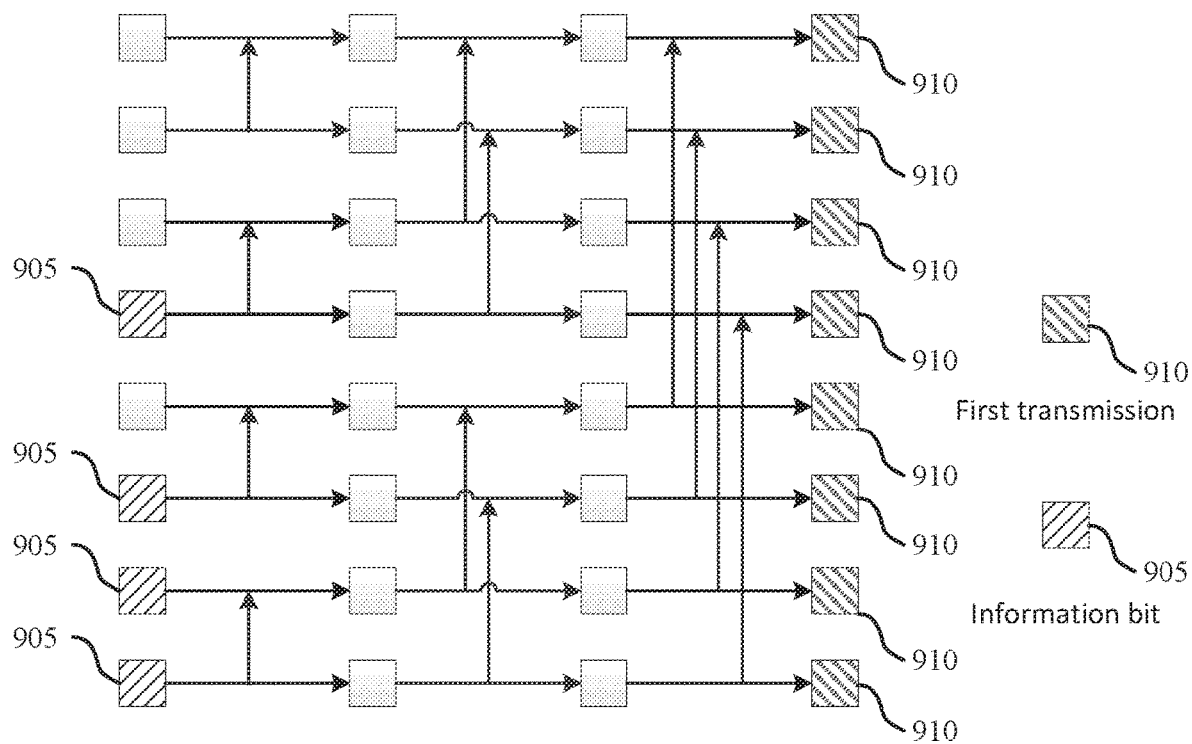
FIG. 9 illustrates an example of an initial HARQ transmission in accordance with one or more aspects of the present disclosure.

FIG. 9 illustrates an example of an initial HARQ transmission 900, in accordance with one or more aspects of the present disclosure. Information hit allocation according to the initial HARQ transmission 900 may assume k=4 and M1=10. The initial HARQ transmission 900 may include allocated information bits 905 and transmitted code bits 910. The remaining polar bits may be considered to be punctured.

Figure 10:
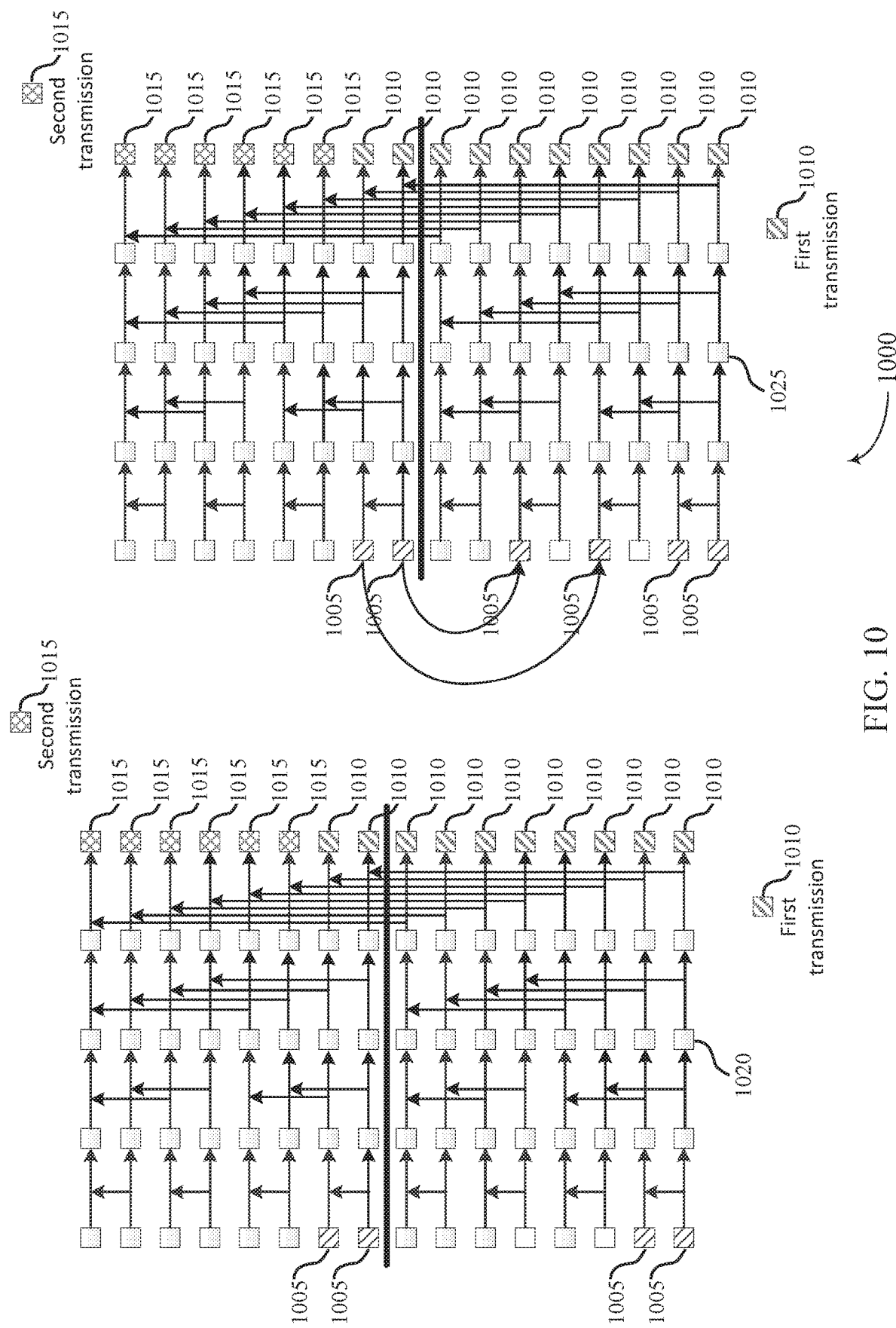
FIG. 10 illustrates an example of an HARQ retransmission, in accordance with one or more aspects of the present disclosure.

FIG. 10 illustrates an example of an HARQ retransmission 1000, in accordance with one or more aspects of the present disclosure. The HARQ retransmission 1000 includes allocated information bits 1005 and transmitted code bits 1010. Upon retransmission, six additional coded bits 1015 may be transmitted. Information bit allocation according to HARQ retransmission 1000 may be recalculated assuming that the six additional coded bits 1015 are transmitted, i.e., k=4 and M1+M2=16. Information bit allocation may be recalculated based on a code rate R2=k/(M1+M2)=4/16, as shown in the HARQ retransmission prior to recalculation 1020. In some examples, the information bit allocation may change across the first transmission and the retransmission. For example, information locations in a non-overlapping part of the information set allocation may be replicated in both locations, as shown in the HARQ retransmission after recalculation 1025. The replication may be done in order to maintain consistency across the IR-HARQ transmissions. From the point of view of the decoder, SC or SCL decoding may be employed to perform decoding sequentially. The unpunctured part of the overall polar codeword may be decoded sequentially with the retransmission portion of the overall coded bits decoded first. In some examples, once some of the decisions on the information bits 1005 in HARQ retransmission 1025 are determined, their decisions may be used in decoding when decoding the corresponding bits 1005 in previous transmissions.

Figure 11:
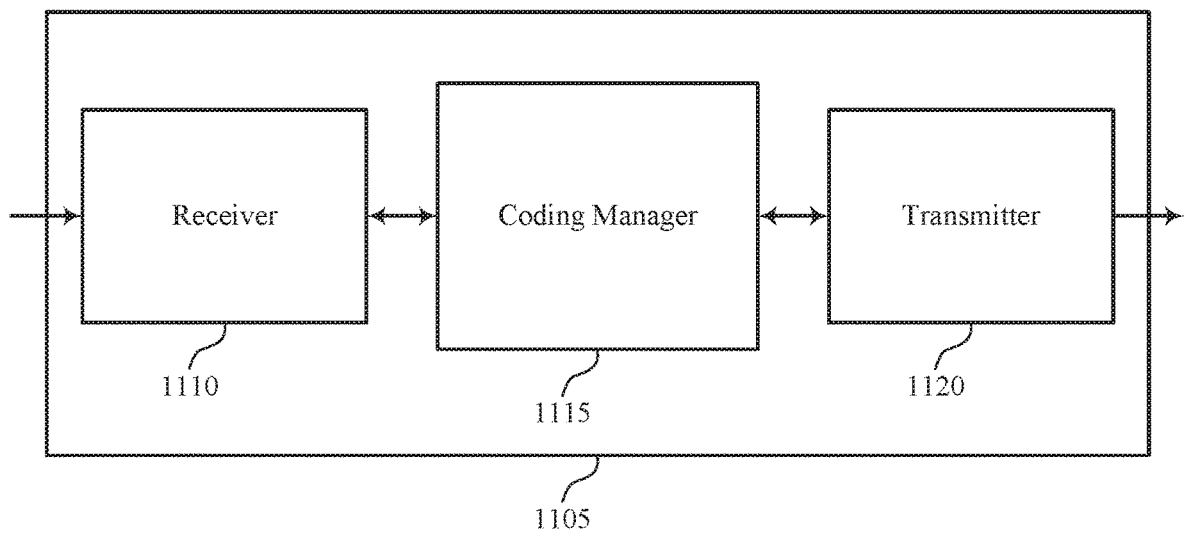
FIGS. 11 through 13 show block diagrams of a device that supports bit allocation for encoding and/or decoding in accordance with aspects of the present disclosure.

FIG. 11 shows a block diagram 1100 of a wireless device 1105 that supports bit allocation for encoding and decoding in accordance with various aspects of the present disclosure. Wireless device 1105 may be an example of aspects of a UE 115 or base station 105 as described with reference to FIG. 1. Wireless device 1105 may include receiver 1110, coding manager 1115, and transmitter 1120. Wireless device 1105 may also include a processor. Each of these components may be in communication with one another (e.g., via one or more buses).

Receiver 1110 may receive information such as packets, user data, or control information associated with various information channels (e.g., control channels, data channels, and information related to bit allocation for encoding and decoding, etc.). Information may be passed on to other components of the device. The receiver 1110 may be an example of aspects of the transceiver 1435 described with reference to FIG. 14.

Coding manager 1115 may be an example of aspects of the coding manager 1415 described with reference to FIG. 14. Coding manager 1115 and/or at least some of its various sub-components may be implemented in hardware, software executed by a processor, firmware, or any combination thereof. If implemented in software executed by a processor, the functions of the coding manager 1115 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The coding manager 1115 and/or at least some of its various sub-components may be physically located at various positions, including being distributed such that portions of functions are implemented at different physical locations by one or more physical devices. In some examples, coding manager 1115 and/or at least some of its various sub-components may be a separate and distinct component in accordance with various aspects of the present disclosure. In other examples, coding manager 1115 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Coding manager 1115 may identify a set of channel instances of a channel associated with transmission of a vector comprising a first plurality of information bits, wherein one or more groups of the plurality of channel instances are recursively partitioned into a plurality of sections, allocate the first plurality of information bits among one or more of the groups based at least in part on a reliability metric associated with the channel, perform an encoding operation to encode the vector based at least in part on the allocation of the first plurality of information bits among one or more of the groups and a size of at least one of the one or more groups, and transmit the encoded vector using the set of channel instances. The coding manager 1115 may also receive a codeword for decoding, the codeword comprising a first plurality of information bits, identify a plurality of channel instances of a channel associated with reception of the codeword, wherein the plurality of channel instances are recursively partitioned into a plurality of groups, assign bit types to at least a subset of the plurality of channel instances based at least in part on a reliability metric associated with the channel and a size of at least one of the plurality of groups, and perform a decoding operation of one or more portions of the codeword to obtain the first plurality of information bits based at least in part on the assigned bit types.

Transmitter 1120 may transmit signals generated by other components of the device. In some examples, the transmitter 1120 may be collocated with a receiver 1110 in a transceiver module. For example, the transmitter 1120 may be an example of aspects of the transceiver 1435 described with reference to FIG. 14. The transmitter 1120 may include a single antenna, or it may include a set of antennas. In aspects, the set of channel instances may be divided into one or more groups. In aspects, each group of channel instances may be polarized. Further, mutual information may be employed to determine a location for one or more information bits among the one or more groups. At least one base sequence may correspond or depend on a size of one of the one or more groups, Employing such division of channel instances into groups, polarization of such groups, and employing mutual information to locate information bits has reduced complexity compared to existing polar coding for such channel instances.

Figure 12:
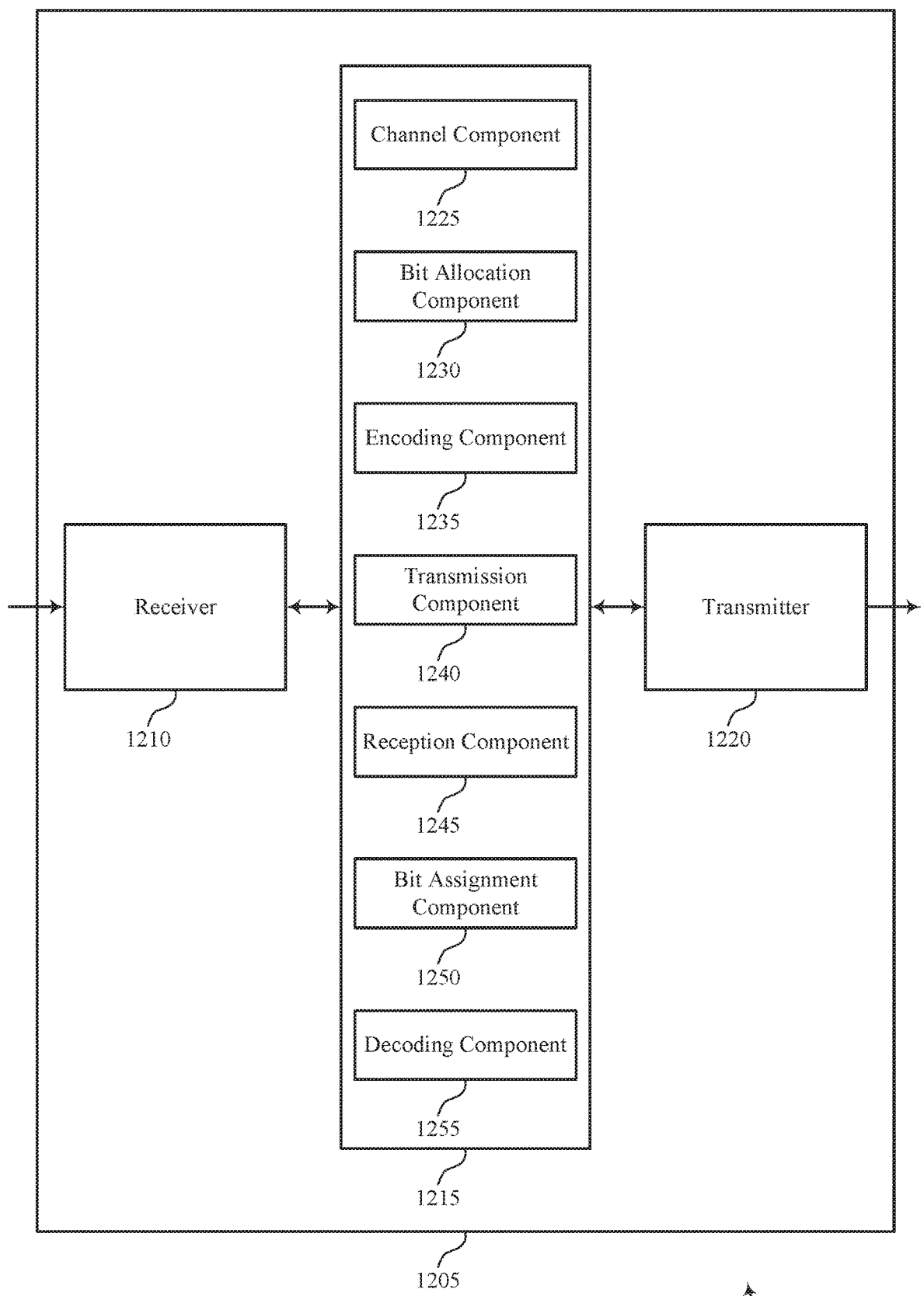

FIG. 12 shows a block diagram 1200 of a wireless device 1205 that supports bit allocation for encoding and decoding in accordance with various aspects of the present disclosure. Wireless device 1205 may be an example of aspects of a wireless device 1105 or a UE 115 or base station 105 as described with reference to FIGS. 1 and 11. Wireless device 1205 may include receiver 1210, coding manager 1215, and transmitter 1220. Wireless device 1205 may also include a processor, Each of these components may be in communication with one another (e.g., via one or more buses).

Receiver 1210 may receive information such as packets, user data, or control information associated with various information channels (e.g., control channels, data channels, and information related to bit allocation for encoding and decoding, etc.). Information may be passed on to other components of the device. The receiver 1210 may be an example of aspects of the transceiver 1435 described with reference to FIG. 14.

Coding manager 1215 may be an example of aspects of the coding manager 1415 described with reference to FIG. 14. Coding manager 1215 may also include channel component 1225, bit allocation component 1230, encoding component 1235, transmission component 1240, reception component 1245, bit assignment component 1250, and decoding component 1255.

Channel component 1225 may identify a plurality of channel instances after multi-stage polarization of a channel associated with transmission of a vector including a first plurality of information hits, where one or more groups of the plurality of channel instances are recursively partitioned into a plurality of sections. The channel component 925 may also identify a plurality of channel instances of a channel associated with reception of a codeword, where the plurality of channel instances are recursively partitioned into a plurality of groups. In some cases, the vector comprises a plurality of encoded bits determined based at least in part on a vector of encoded input bits comprising a set of information hits and a set of frozen bits. In some cases, a smallest group size is a power of 2. In some cases, a smallest group size is not a power of 2.

Bit allocation component 1230 may allocate the first plurality of information bits among one or more of the groups based on a reliability metric associated with the channel. In some cases, allocating the first plurality of information bits among the groups is based on a base sequence based on the size of at least one of the groups. In some cases, the base sequence is not based on the size of the vector. In some cases, the reliability metric may be associated with a corresponding equivalent channel after a polarization operation. In some cases, the reliability metric of the channel includes a capacity of the channel, a reliability of the channel, a mean square error of the channel, an information rate of the channel, or any combination thereof, in some cases, the allocating the first plurality of information bits includes: determining a first output rate associated with a first group of the one or more groups and determining a number of information bits to be allocated to the first group based on the first output rate or equivalent ways of reaching such computation. In some cases, the determining the first output rate is based on data indicating a relationship between one or more channel instances and the channel. In some cases, the data is for at least one of a binary erasure channel (BEC), binary symmetric channel (BSC), or an additive white Gaussian noise (AWGN) channel. In some cases, the allocating the first plurality of information bits further includes: determining a second output rate associated with a second group of the one or more groups and determining a number of information bits to be allocated to the second group based on the second output rate. In some cases, the first output rate is different from the second output rate. In some cases, the first output rate is based on a size of the first group and the second output rate is based on a size of the second group. In some cases, the allocating the first plurality of information bits further includes: determining one or more information bit locations for a group based at least in part on the number of information bits and a common base sequence. In some cases, bit allocation component 930 may allocate, among one or more of the groups, a second plurality of information bits associated with the portion of the encoded vector. In some cases, the second plurality of information bits may correspond to respective ones of the first plurality of information bits.

Encoding component 1235 may perform an encoding operation to encode the vector based on the allocation of the first plurality of information bits among the one or more groups and a size of at least one of the groups. In some cases, the encoding operation includes at least one of a polar coding operation, a Reed-Muller (RM) coding operation, or a polar RM operation, or cyclic redundancy check (CRC) concatenated polar operation.

Transmission component 1240 may transmit the encoded vector using the set of channel instances. Transmission component 940 may retransmit, using one or more of the plurality of channel instances, a portion of the encoded vector based at least in part on reception of a negative acknowledgement (NACK) message. In some cases, transmission component 940 may transmit the incremental redundant coded bits of the first transmission bits with retransmission of the first plurality of retransmitted information bits as part of a larger polar codeword. Transmission component 940 may transmit, upon an unsuccessful decoding operation, a NACK message. In some cases, a bit location for at least one of the first plurality of information bits during the previous transmission of the encoded vector is different from a bit location for a respective information bit of the second plurality of information bits after the reception of the initial transmission and retransmission of the collective encoded vector. The hit locations may be calculated or derived based oat least in part on the information bit K allocation over the respective overall code length after the reception of all. IR-HARQ transmissions. In some cases, bit locations for each of the first plurality of information bits are different from bit locations of respective information bits of the second plurality of information bits after retransmission. In some such examples, information allocated to non-overlapping bit locations may be copied from the locations in the retransmission to the locations in the initial transmission, e.g., in order to keep the overall polar received codeword consistent across IR-HARQ transmissions.

Reception component 1245 may receive a codeword for decoding, the codeword including a first plurality of information bits. Reception component 945 may also receive a retransmission of at least a portion of the codeword including at least a part of a second plurality of information bits. In some cases, a bit location (e.g., group in which the bit is located) for at least one information bit of the second plurality of information bits is different from a bit location of a respective information bit of the first plurality of information bits. In some such examples, information allocated to non-overlapping bit locations may be copied from the locations in the retransmission to the locations in the initial transmission, e.g., in order to keep the overall polar received codeword consistent across IR-HARQ transmissions.

Bit assignment component 1250 may assign bit types to at least a subset of the plurality of channel instances based on a reliability metric associated with the channel and a size of at least one of the groups. In some cases, the bit types include information bits, frozen bits, parity bits, or any combination thereof. In some cases, the base sequence is not based on the size of the codeword. In some cases, the reliability metric of the channel includes a capacity of the channel, a reliability of the channel, an information rate of the channel, or any combination thereof. In some cases, the assigning the bit types includes: determining a first output rate associated with a first group of the one or more groups and determining a number of information bit types to be assigned to the first group based on the first output rate. In some cases, the assigning the bit types is based on a base sequence based on the size of at least one of the groups. In some cases, the first output rate is different from the second output rate. In some cases, the first output rate is based on a size of the first group and the second output rate is based on a size of the second group. In some cases, the determining the first output rate is based on data indicating a relationship between one or more channel instances and the channel. In some cases, the data is for at least one of a BEC, BSC, or an AWGN channel. In some cases, the assigning the bit types further includes: determining a second output rate associated with a second group of the one or more groups and determining a number of information bit types to be assigned to the second group based on the second output rate. In some cases, the bit assignment at the receiver may be expected to be the same as that from transmitter.

Decoding component 1255 may perform a decoding operation of one or more portions of the codeword to obtain the first plurality of information bits based on the assigned bit types. In some cases, the decoding operation includes at least one of a polar coding operation, an RM coding operation, or a polar RM operation.

Transmitter 1220 may transmit signals generated by other components of the device. In some examples, the transmitter 1220 may be collocated with a receiver 1210 in a transceiver module. For example, the transmitter 1220 may be an example of aspects of the transceiver 1435 described with reference to FIG. 14, The transmitter 1220 may include a single antenna, or it may include a set of antennas.

Figure 13:
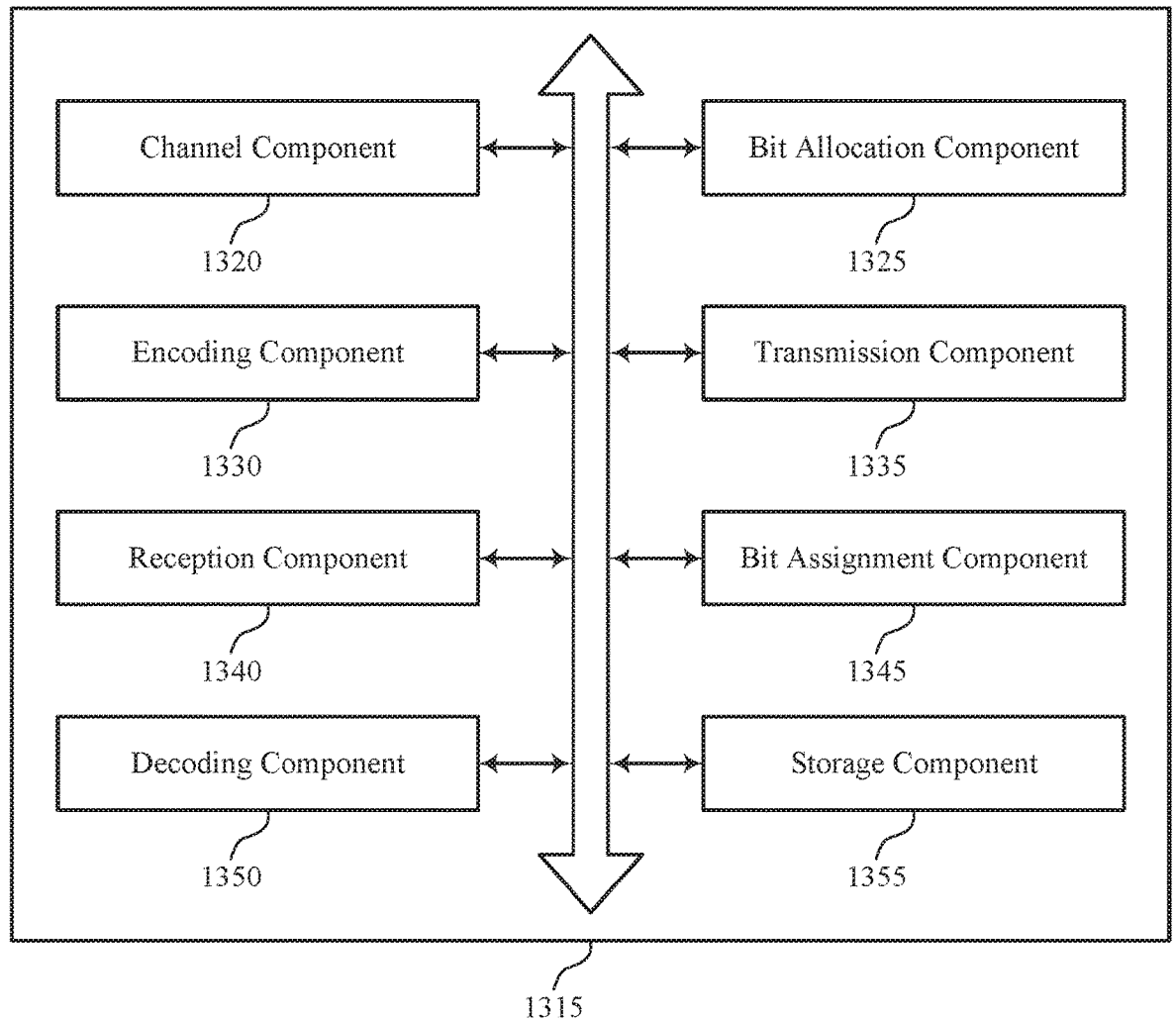

FIG. 13 shows a block diagram 1300 of a coding manager 1315 that supports bit allocation for encoding and decoding in accordance with various aspects of the present disclosure. The coding manager 1315 may be an example of aspects of a coding manager 1115, a coding manager 1215, or a coding manager 1415 described with reference to FIGS. 11, 12, and 14. The coding manager 1315 may include channel component 1320, bit allocation component 1325, encoding component 1330, transmission component 1335, reception component 1340, bit assignment component 1345, decoding component 1350, and storage component 1355. Each of these modules may communicate, directly or indirectly, with one another (e.g., via one or more buses).

Channel component. 1320 may identify a plurality of channel instances of a channel associated with transmission of a vector including a first plurality of information bits. In some cases, the plurality of channel instances are recursively partitioned into one or more groups. The channel component 1320 may identify a plurality of channel instances of a channel associated with reception of the codeword, where the plurality of channel instances are recursively partitioned into one or more groups. In some examples, the plurality of channel instances in each group before polarization may or may not be the same due to, e.g., puncturing/shortening or bit modulation mapping. In some cases, a smallest group size is not a power of 2. In some cases, a smallest group size is not a power of 2.

Bit allocation component 1325 may allocate the first plurality of information bits among one or more groups based on a reliability metric associated with the channel with multi-stage polarization. In some cases, the allocating the first plurality of information bits among the one or more groups is based on a base sequence based on the size of at least one of the groups. In some cases, the base sequence is not based on the size of the vector. In some cases, the reliability metric of the channel includes a capacity of the channel, a reliability of the channel, an information rate of the channel, or any combination thereof. In some cases, the allocating the first plurality of information bits includes: determining a first output rate associated with a first group of the one or more groups and determining a number of information bits to be allocated to the first group based on the first output rate. In some cases, the determining the first output rate is based on data indicating a relationship between one or more channel instances and the channel. In some cases, the data is for at least one of a BEC, BSC, an AWGN channel, or some combination thereof in some cases, the allocating the first plurality of information bits further includes: determining a second output rate associated with a second group of the one or more groups and determining a number of information bits to be allocated to the second group based on the second output rate. In some cases, the first output rate is different from the second output rate. In some cases, the first output rate is based on a size of the first group and the second output rate is based on a size of the second group. Bit allocation component 1325 may compute an information bit allocation for each of the first group and the second group based at least in part on a total number of information bits to be allocated and the reliability metric. In some cases, bit allocation component 1325 may allocate, among one or more of the groups, a second plurality of information bits associated with the portion of the encoded vector. In some cases, the second plurality of information bits may correspond to respective ones of the first plurality of information bits.

Encoding component 1330 may perform an encoding operation to encode the vector based on the allocation of the first plurality of information bits among the one or more groups and a size of at least one of the groups. In some cases, the encoding or decoding operation includes at least one of a polar coding operation, a RM coding operation, a belief propagation decoding operation for low-density parity-check (LDPC) codes, or a polar RM operation.

Transmission component 1335 may transmit the encoded vector using the set of channel instances. Transmission component 1035 may retransmit, using one or more of the plurality of channel instances, a portion of the encoded vector based at least in part on reception of a NACK message. In some cases, transmission component 1035 may retransmit each of the first plurality of information bits. Transmission component 1035 may transmit, upon an unsuccessful decoding operation, a NACK message. In some cases, a bit location for at least one of the first plurality of information bits during transmission of the encoded vector is different from a bit location for a respective information bit of the second plurality of information bits after reception of all transmissions of the encoded vector, in some cases, bit locations for each of the first plurality of information bits are different from bit locations of respective information bits of the second plurality of information bits.

Reception component 1340 may receive a codeword for decoding, the codeword including a first plurality of information hits. In some cases, the reception of the codeword comprises a reception portion and an exclusive or portion in a polarization transform. Reception component 1040 may also receive a retransmission of at least a portion of the codeword including a second plurality of information bits. In some cases, a bit location for at least one information hit of the second plurality of information bits is different from a bit location of a respective information bit of the first plurality of information bits. In some such examples, information allocated to non-overlapping bit locations may be copied from the locations in the retransmission to the locations in the initial transmission, e.g., in order to keep the overall polar received codeword consistent across IR-HARQ transmissions.

Bit assignment component 1345 may assign bit types to at least a subset of the plurality of channel instances based on a reliability metric associated with the channel and a size of at least one of the groups. In some cases, the bit types include information bits, frozen bits, parity hits, or any combination thereof. In some cases, the base sequence is not based on the size of the codeword. In some cases, the reliability metric of the channel includes a capacity of the channel, a reliability of the channel, an information rate of the channel, or any combination thereof. In some cases, the assigning the bit types includes: determining a first output rate associated with a first group of the groups and determining a number of information bit types to be assigned to the first group based on the first output rate. In some cases, the assigning the bit types is based on a base sequence based on the size of at least one of the groups. In some cases, the first output rate is different from the second output rate. In some cases, an average of the first output rate and the second output rate equals an original channel rate before polarization. In some cases, the first output rate is based on a size of the first group and the second output rate is based on a size of the second group. In some cases, the first and second output rates may be based at least in part on a total number of information bits allocated to the first and second groups. In some cases, the determining the first output rate is based on data indicating a relationship between one or more channel instances and the channel. In some cases, the data is for at least one of a BEC, BSC, or an A WGN channel. In some cases, the assigning the bit types further includes: determining a second output rate associated with a second group of the groups and determining a number of information bit types to be assigned to the second group based on the second output rate. In some cases, bit assignment component 1045 may determine one or more information bit locations for a group based at least in part on the number of information bits and one or more base sequences of the plurality of base sequences.

Decoding component 1350 may perform a decoding operation of one or more portions of the codeword to obtain the first plurality of information bits based on the assigned bit types. In some cases, the decoding operation includes at least one of a polar coding operation, a RM coding operation, or a polar RM operation.

Storage component 1355 may store a base sequence for information bit allocation corresponding to a given group size and a given number of information bit locations associated with the given group size. Storage component 955 may store one or more base sequences, each of the one or more base sequences based on at least one of a given group size or the locations associated with the given group. In some cases, each of the one or more base sequences may be determined based at least in part on a density evolution technique, a density evolution technique based at least in part on a Gaussian approximation (mean value evolution) technique, a mutual information technique, a mean square error density evolution technique, or a polarization weight technique, in some other cases, each of the one or more base sequences may be obtained via a computer search through simulations. In some cases, the given group size is constant for each of the given number of information bit locations.

Figure 14:
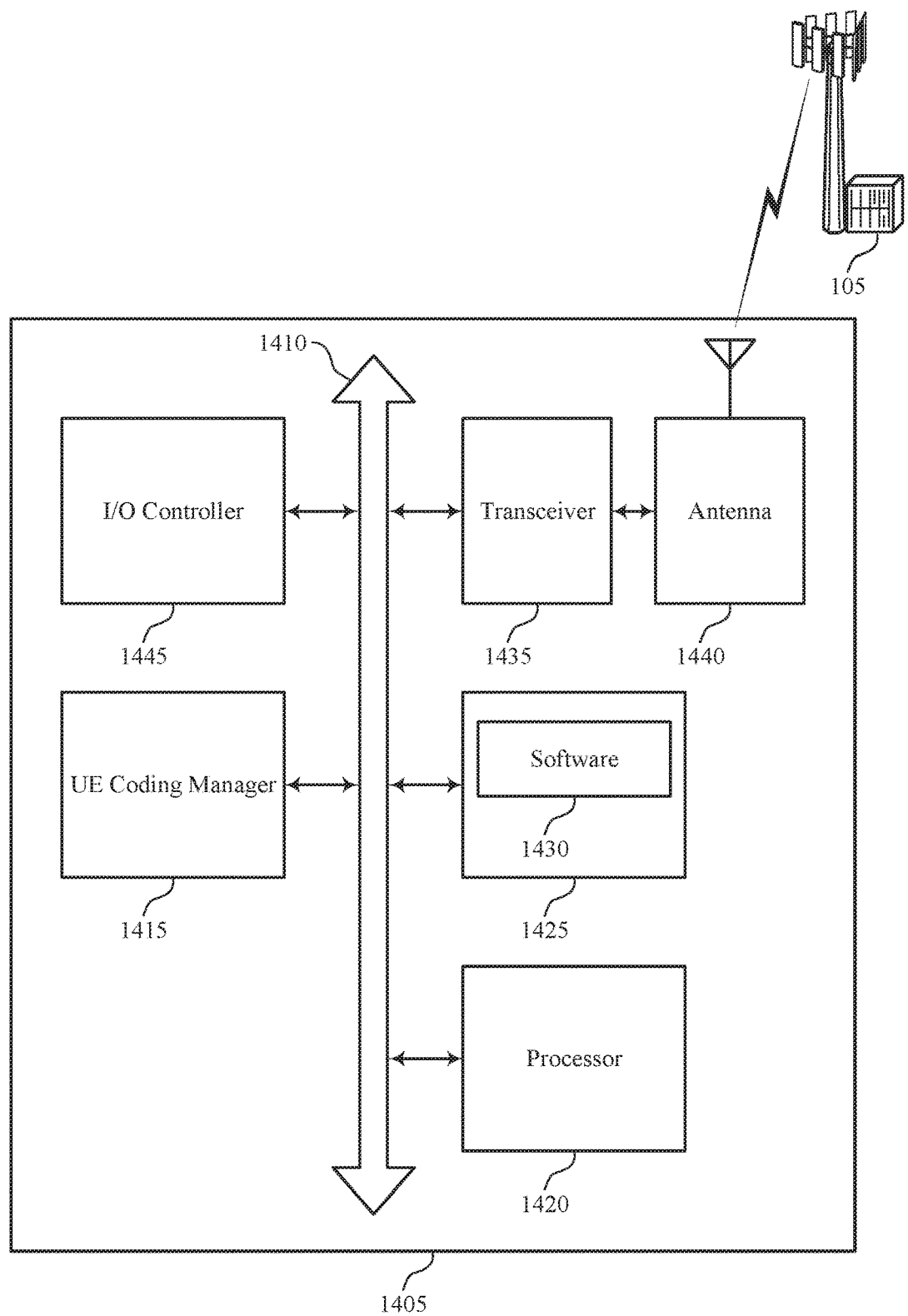
FIG. 14 illustrates a block diagram of a system including a UE that supports bit allocation for encoding and/or decoding in accordance with aspects of the present disclosure.

FIG. 14 shows a diagram of a system 1400 including a device 1405 that supports bit allocation for encoding and decoding in accordance with various aspects of the present disclosure. Device 1405 may be an example of or include the components of wireless device 1105, wireless device 1205, or a UE 115 as described above, e.g., with reference to FIGS. 1, 11 and 12. Device 1405 may include components for bi-directional voice and data communications including components for transmitting and receiving communications, including UE coding manager 1415, processor 1420, memory 1425, software 1430, transceiver 1435, antenna 1440, and controller 1445. These components may be in electronic communication via one or more busses (e.g., bus 1410). Device 1405 may communicate wirelessly with one or more base stations 105.

Processor 1420 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1420 may be configured to operate a memory array using a memory controller. In other cases, a memory controller may be integrated into processor 1420. Processor 1420 may be configured to execute computer-readable instructions stored in a memory to perform various functions (e.g., functions or tasks supporting bit allocation for encoding and decoding).

Memory 1425 may include random access memory (RAM) and read only memory (ROM). The memory 1425 may store computer-readable, computer-executable software 1430 including instructions that, when executed, cause the processor to perform various functions described herein. In some cases, the memory 1425 may contain, among other things, a basic input/output system (BIOS) which may control basic hardware and/or software operation such as the interaction with peripheral components or devices.

Software 1430 may include code to implement aspects of the present disclosure, including code to support bit allocation for encoding and decoding. Software 1430 may be stored in a non-transitory computer-readable medium such as system memory or other memory. In some cases, the software 1430 may not be directly executable by the processor but may cause a computer (e.g., when compiled and executed) to perform functions described herein.

Transceiver 1435 may communicate bi-directionally, via one or more antennas, wired, or wireless links as described above. For example, the transceiver 1435 may represent a wireless transceiver and may communicate bi-directionally with another wireless transceiver. The transceiver 1435 may also include a modem to modulate the packets and provide the modulated packets to the antennas for transmission, and to demodulate packets received from the antennas.

In some cases, the wireless device may include a single antenna 1440. However, in some cases the device may have more than one antenna 1440, which may be capable of concurrently transmitting or receiving multiple wireless transmissions.

I/O controller 1445 may manage input and output signals for device 1405. I/O controller 1445 may also manage peripherals not integrated into device 1405. In some cases, I/O controller 1445 may represent a physical connection or port to an external peripheral. In some cases, I/O controller 1445 may utilize an operating system such as iOS®, ANDROID®, MS-DOS®, MS-WINDOWS®, OS/2®, UNIX®, LINUX®, or another known operating system. In other cases, I/O controller 1445 may represent or interact with a modem, a keyboard, a mouse, a touchscreen, or a similar device, in some cases, I/O controller 1445 may be implemented as part of a processor. In some cases, a user may interact with device 1405 via I/O controller 1445 or via hardware components controlled by I/O controller 1445.

Figure 15:
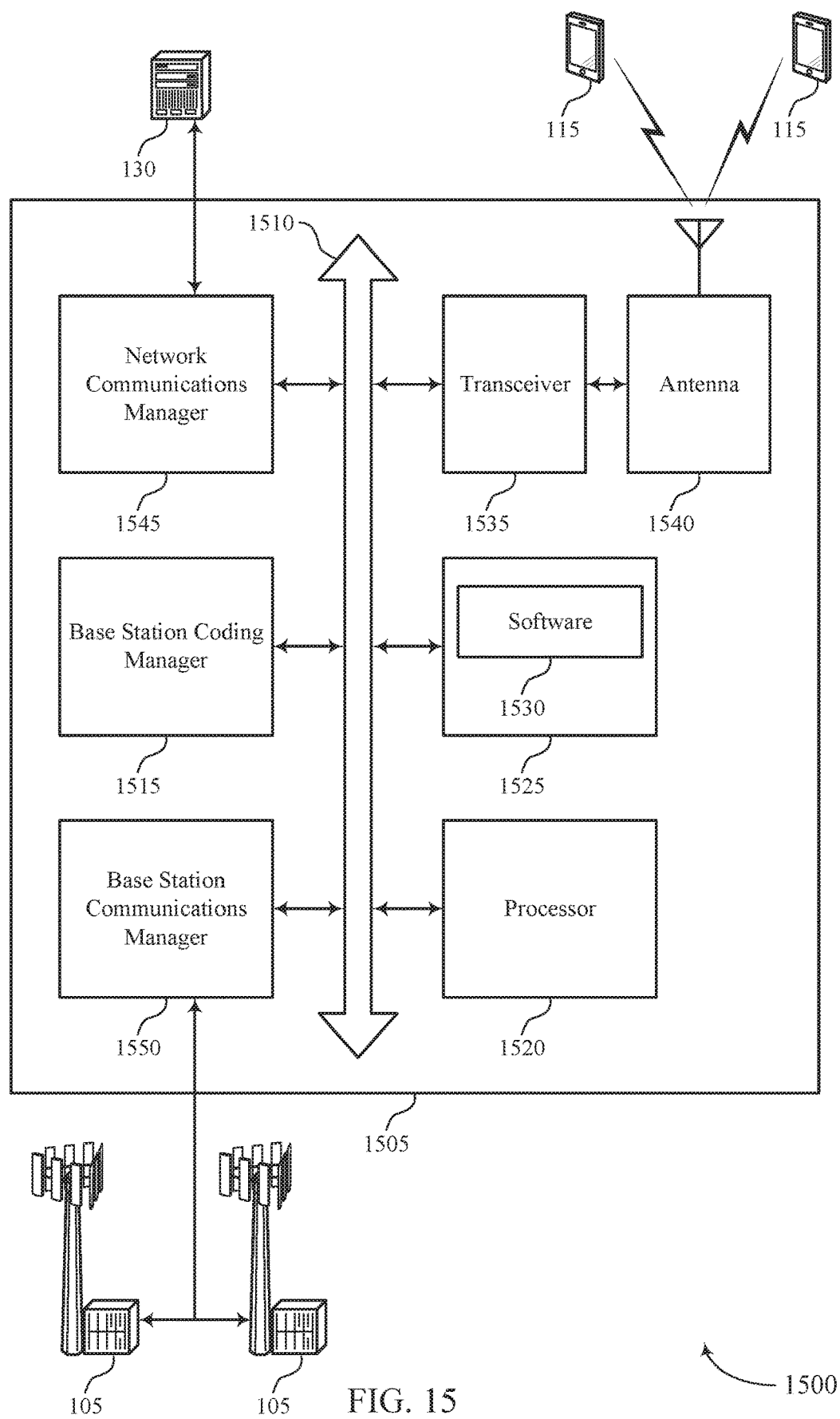
FIG. 15 illustrates a block diagram of a system including a base station that supports bit allocation for encoding and/or decoding in accordance with aspects of the present disclosure.

FIG. 15 shows a diagram of a system 1500 including a device 1505 that supports bit allocation for encoding and decoding in accordance with various aspects of the present disclosure. Device 1505 may be an example of or include the components of wireless device 1205, wireless device 1305, or a base station 105 as described above, e.g., with reference to FIGS. 1, 12 and 13. Device 1505 may include components for bi-directional voice and data communications including components for transmitting and receiving communications, including base station coding manager 1515, processor 1520, memory 1525, software 1530, transceiver 1535, antenna 1540, network communications manager 1545, and base station communications manager 1550. These components may be in electronic communication via one or more busses (e.g., bus 1510). Device 1505 may communicate wirelessly with one or more UEs 115.

Processor 1520 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1520 may be configured to operate a memory array using a memory controller. In other cases, a memory controller may be integrated into processor 1520. Processor 1520 may be configured to execute computer-readable instructions stored in a memory to perform various functions (e.g., functions or tasks supporting bit allocation for encoding and decoding).

Memory 1525 may include RAM and ROM. The memory 1525 may store computer-readable, computer-executable software 1530 including instructions that, when executed, cause the processor to perform various functions described herein. In some cases, the memory 1525 may contain, among other things, a BIOS which may control basic hardware and/or software operation such as the interaction with peripheral components or devices.

Software 1530 may include code to implement aspects of the present disclosure, including code to support bit allocation for encoding and decoding. Software 1530 may be stored in a non-transitory computer-readable medium such as system memory or other memory. In some cases, the software 1530 may not be directly executable by the processor but may cause a computer (e.g., when compiled and executed) to perform functions described herein.

Transceiver 1535 may communicate bi-directionally, via one or more antennas, wired, or wireless links as described above. For example, the transceiver 1535 may represent a wireless transceiver and may communicate bi-directionally with another wireless transceiver. The transceiver 1535 may also include a modem to modulate the packets and provide the modulated packets to the antennas for transmission, and to demodulate packets received from the antennas.

In some cases, the wireless device may include a single antenna 1540. However, in some cases the device may have more than one antenna 1540, which may be capable of concurrently transmitting or receiving multiple wireless transmissions.

Network communications manager 1545 may manage communications with the core network (e.g., via one or more wired backhaul links). For example, the network communications manager 1545 may manage the transfer of data communications for client devices, such as one or more UEs 115.

Base station communications manager 1550 may manage communications with other base station 105, and may include a controller or scheduler for controlling communications with UEs 115 in cooperation with other base stations 105. For example, the base station communications manager 1550 may coordinate scheduling for transmissions to UEs 115 for various interference mitigation techniques such as beamforming or joint transmission. In some examples, base station communications manager 1550 may provide an X2 interface within an LTE/LTE-A wireless communication network technology to provide communication between base stations 105.

Figure 16:
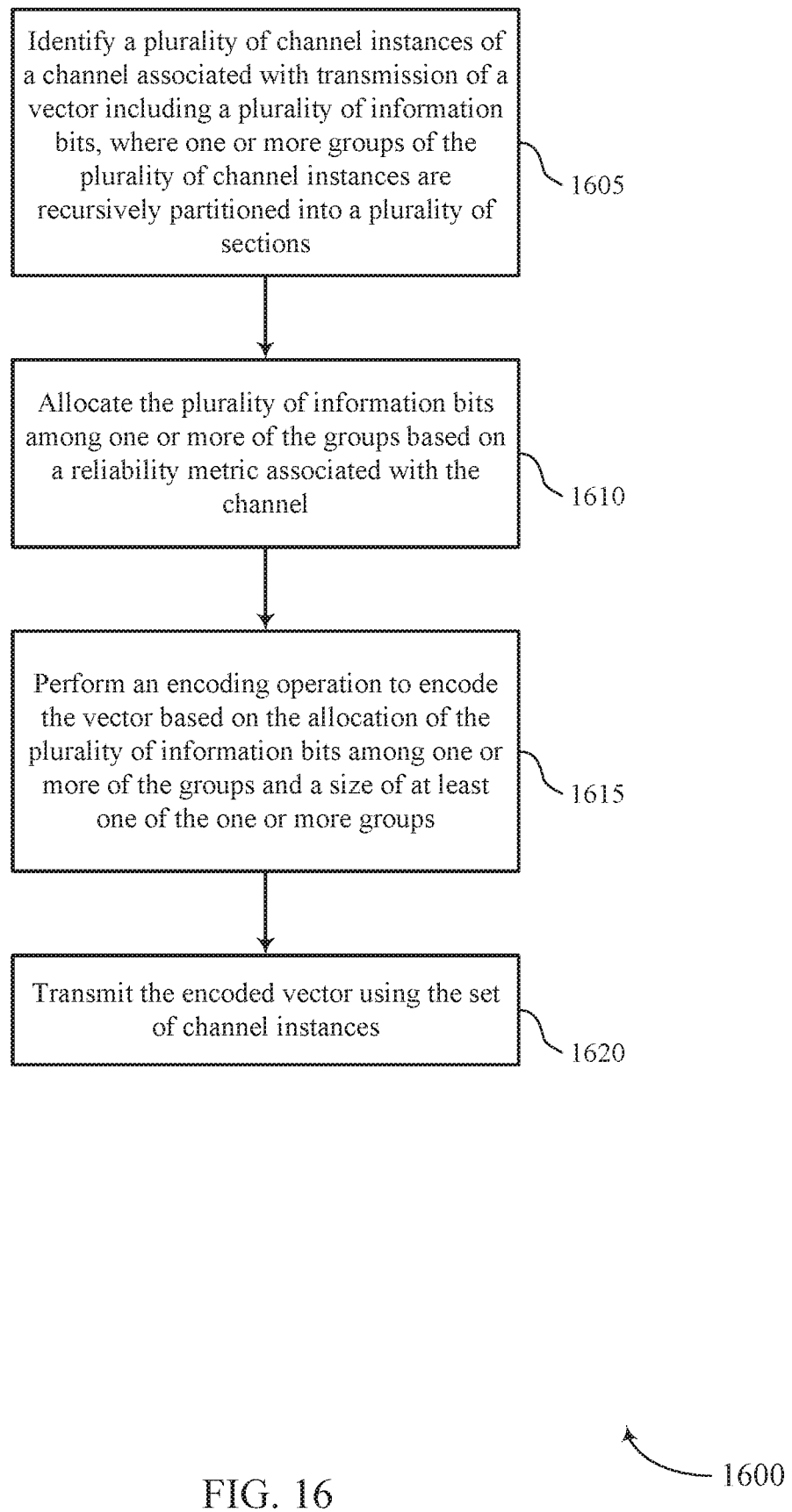
FIGS. 16 through 17 illustrate methods for bit allocation for encoding and/or decoding in accordance with aspects of the present disclosure.

FIG. 16 shows a flowchart illustrating a method 1600 for bit allocation for encoding and decoding in accordance with various aspects of the present disclosure. The operations of method 1600 may be implemented by a UE 115 or base station 105 or its components as described herein. For example, the operations of method 1600 may be performed by a coding manager as described with reference to FIGS. 11 through 13. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1605 the UE 115 or base station 105 may identify a plurality of channel instances with multi-stage polarization of a channel associated with transmission of a vector comprising a plurality of information bits, wherein the plurality of channel instances are recursively partitioned into a plurality of groups. The operations of block 1605 may be performed according to the methods described with reference to FIGS. 1 through 6. In certain examples, aspects of the operations of block 1605 may be performed by a channel component as described with reference to FIGS. 11 through 13.

At block 1610 the UE 115 or base station 105 may allocate the plurality of information bits among one or more of the plurality of groups based at least in part on a reliability metric associated with the channel. The operations of block 1610 may be performed according to the methods described with reference to FIGS. 1 through 6. In certain examples, aspects of the operations of block 1610 may be performed by a bit allocation component as described with reference to FIGS. 11 through 13.

At block 1615 the UE 115 or base station 105 may perform an encoding operation to encode the vector based at least in part on the allocation of the plurality of information bits among the plurality of groups and a size of at least one of the plurality of groups. The operations of block 1615 may be performed according to the methods described with reference to FIGS. 1 through 6. In certain examples, aspects of the operations of block 1615 may be performed by an encoding component as described with reference to FIGS. 11 through 13.

At block 1620 the UE 115 or base station 105 may transmit the encoded vector using the plurality of channel instances. The operations of block 1620 may be performed according to the methods described with reference to FIGS. 1 through 6. In certain examples, aspects of the operations of block 1620 may be performed by a transmission component as described with reference to FIGS. 11 through 13.

Figure 17:
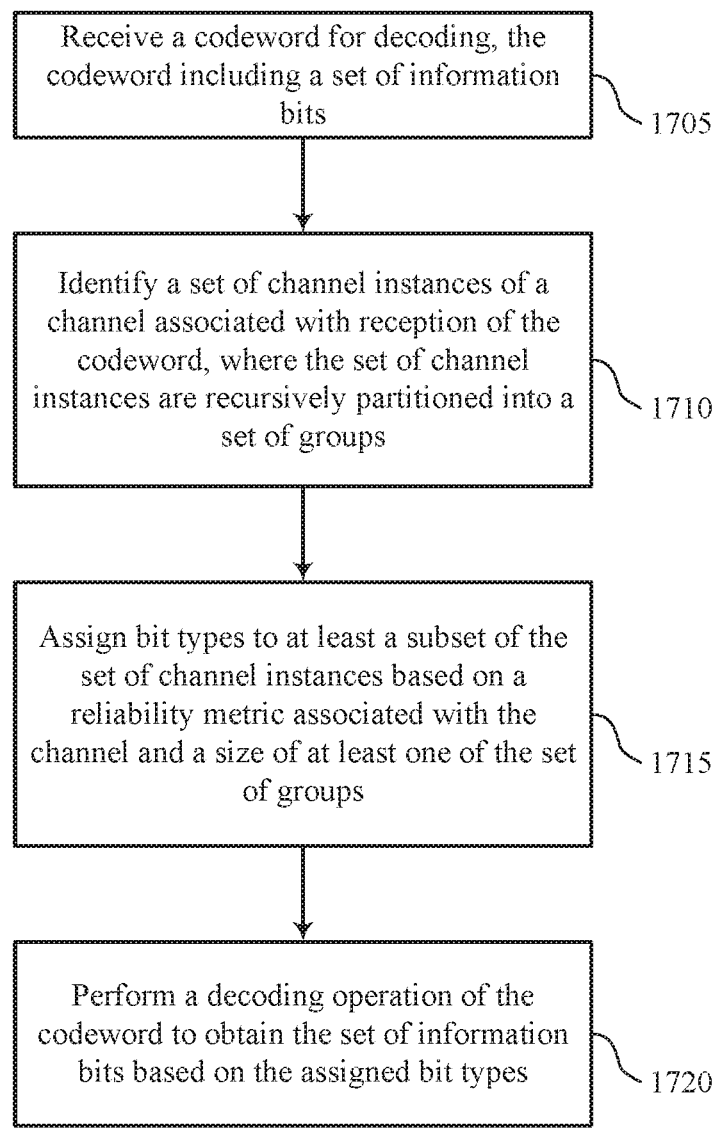

FIG. 17 shows a flowchart illustrating a method 1700 for bit allocation for encoding and decoding in accordance with various aspects of the present disclosure. The operations of method 1700 may be implemented by a UE 115 or base station 105 or its components as described herein. For example, the operations of method 1700 may be performed by a coding manager as described with reference to FIGS. 11 through 13. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1705 the UE 115 or base station 105 may receive a codeword for decoding, the codeword comprising a plurality of information bits. The operations of block 1705 may be performed according to the methods described with reference to FIGS. 1 through 6. In certain examples, aspects of the operations of block 1705 may be performed by a reception component as described with reference to FIGS. 11 through 13.

At block 1710 the UE 115 or base station 105 may identify a plurality of channel instances of a channel associated with reception of the codeword, wherein the plurality of channel instances are recursively partitioned into a plurality of groups. The operations of block 1710 may be performed according to the methods described with reference to FIGS. 1 through 6. In certain examples, aspects of the operations of block 1710 may be performed by a channel component as described with reference to FIGS. 11 through 13.

At block 1715 the UE 115 or base station 105 may assign bit types to at least a subset of the plurality of channel instances based at least in part on a reliability metric associated with the channel and a size of at least one of the plurality of groups. The operations of block 1715 may be performed according to the methods described with reference to FIGS. 1 through 6. In certain examples, aspects of the operations of block 1715 may be performed by a bit assignment component as described with reference to FIGS. 11 through 13.

At block 1720 the UE 115 or base station 105 may perform a decoding operation of one or more portions of the codeword to obtain the plurality of information bits based at least in part on the assigned bit types. In aspects, the decoding operation may be based on the mutual information (e.g., mutual information based on the mutual information transfer chart). The operations of block 1720 may be performed according to the methods described with reference to FIGS. 1 through 6. In certain examples, aspects of the operations of block 1720 may be performed by a decoding component as described with reference to FIGS. 11 through 13.

It should be noted that the methods described above describe possible implementations, and that the operations and the steps may be rearranged or otherwise modified and that other implementations are possible. Furthermore, aspects from two or more of the methods may be combined. The methods described herein may improve the channel coding across performance and computational complexity while efficiently addressing both block length scaling and rate compatibility. Polar codes may be adopted as channel coding for uplink control information and downlink control information (working assumption) for, as an example, an enhanced Mobile Broadband (eMBB) system.

In some examples, polar code design may be improved by determining the location and distribution of information bits. Reliability metrics may be generated for each U domain (e.g., channel instance) bit (either via SNR dependent numerical density evolution or using a formula), and techniques may be used to sort and select the top most reliable bits in U domain as information bits.

In some examples, polar codes may be constructed based at least in part on the techniques described herein. The construction of polar code may include determining the information bit distribution in different groups in a U domain. Based on the number of information bits and the number of coded bits in each group, a short base sequence (of length for example Nref=64) may be used to determine the locations of information bits in that group. This process may be applied recursively to obtain the locations of information bits in the overall polar code. With this recursive construction, and due to the relatively small computation and storage requirement for base sequence generation/storage, online construction of polar code may be feasible for small block lengths for a downlink channel (K<=~100 and Nmax<512).

Channel polarization may be exploited to create auxiliary channels to achieve coding gains beyond repetition, and to improve the overall channel coding performance. Consider the following example with I-stage polarization. Let W: X→Y be a binary-input discrete memoryless channel where the channel capacity is C=I(X;Y). In a binary-input example, the capacity C may take values between 0 and 1 (0≤C≤1). In some examples, N copies of the channel W may exist in a system. In some examples, the capacity of each channel instance may or may not be the same depending, e.g., on puncturing/shortening/repetition, bit modulation mapping, and/or other channel conditions. A one-to-one mapping may be performed from U to X. The resulting effective channel Wvec may be described based on this mapping $X^N=U^N*G_{N\times N}$, where:

$$G_{N\times N}:\{0,1\}^N \to \{0,1\}^N$$

It may be shown that using polarization to create auxiliary channels via repetition and XOR operation(s) preserves capacity:

$$G_{2\times 2} = \begin{bmatrix} 1 & 0 \\ 1 & 1 \end{bmatrix}$$

If W is a binary erasure channel (BEC) with erasure probability 'ε', then the following may be deduced:

$$U_1=X_1 \oplus X_2=Y_1 \oplus Y_2 \text{ parity-check (XOR)}$$

$$U_2=X_2=X_1 \oplus U_1 \text{ repetition}$$

For a channel $W_1:U_1 \to Y^N$, the following may be deduced:

$$\text{Erasure probability, } \varepsilon^- =1-(1-\varepsilon)^2=2\varepsilon-\varepsilon^2$$

For a channel $W_2:U_2 \to (Y^N, U_1)$, the following may be deduced:

$$\text{Erasure probability, } \varepsilon^+=\varepsilon^2$$

The above operations may be performed recursively, yielding more polarization across N until the decoding of the specific and the following notation may be used:

$$W^+=W_2, W^-=W_1, \text{ where } W^+ \text{ is better than } W^-.$$

To address the question of information bit distribution/allocation of the channel instances after polarization, an example based on BEC where. N coded bits are transmitted through a channel, N/2 of the coded bits will be transmitted via an equivalent channel $W^+$ and N/2 will be transmitted via an equivalent channel $W^-$. As an example, in a system in which N=256, N0 may be 128 for the $W^-$ channel and N1 may be 128 for the $W^+$ channel.

The following observation may be made: for a good (N, K) code of rate R=K/N to be capacity achieving, the information bit distribution over the channels after polarization may be such that the allocated number of information bits leads to a rate that is matched to the capacity and/or rate of the corresponding channel after polarization. The matched number of information bits to capacity of channel after polarization may be used to asymptotically achieve overall channel capacity using successive cancellation (SC) and facilitates SC/SC list (SCL) decoding at finite length.

For example, for BEC channel, suppose an (N, K) code of rate R=K/N is considered. The rate allocated to $W^-$ may be $R0=R^2$, the lower part has $R1=1-(1-R)^2=2R-R^2$. The information bit allocation may be as follows (linear relationship):

The % of info bits to be allocated to $W^-$: K0=R/2*K;

The % of info bits to be allocated to $W^+$: K1=(2-R)/2*K;

This relationship may be applied recursively to obtain fine granularity of information bit distribution with further polarized equivalent channel instances.

In some examples, the above relationship may be modified for the AWGN for the corresponding information bit allocation. To generalize the relationship to other channels, mutual information of channels after polarization (i.e., one channel with repetition coding; one channel with parity check coding (XOR)) may be plotted against the mutual illumination input values. The mutual information output of the upper part channel $W^-$ (channel after XOR) is R0 and the mutual information output of the lower part channel $W^+$ rate (channel after repetition) is R1. The mutual information outputs may be derived from a mutual information transfer chart. Polarization may be used to preserve capacity. For a code that is achieves a preservation of capacity, the following may be satisfied:

$$R(R0+R1)/2$$

The following may also be deduced:

The % of information bits to be allocated to $W^-$:
$K0=R0/R*K/2$;

The % of information bits to be allocated to $W^+$:
$K1=R1/R*K/2$;

The information bit ratio K0/K may be further illustrated as a function of code rate R designed for specific channel. This ratio may be channel dependent and based on information combining. BEC and binary symmetric channels (BSC) may serve as the combining upper and lower bounds on the information bit ratio. Different channels may correspond to different information bit distributions in order to achieve (asymptotically) optimal information allocation on the respective channel. For example, a mixed BEC and AWGN channel may be considered for polar codeword with puncturing/shortening transmitted through an AWGN channel.

Information bits may be allocated recursively for a plurality of stages of polarization based on a relationship to achieve optimal near-optimal info bit allocation for the overall code.

It may be observed that, for each step of polarization, the W− channel and W+ channel may be based on the same reliability order sequence. Based on the same input to W− and W+ channels, the reliability ordering within W− and W+ may be the same. This (asymptotic) reliability ordering invariant property holds based on the input channel distribution being assumed to be the same (typically Gaussian) and the same mutual information transfer chart may be derived based on the common distribution. The above may be used to construct a short sequence to determine information bit location based on the coded bits length Nref and information bits length Ki for all Nref-bit groups of the overall code. An information bit rate/ratio relationship may be applied recursively to get a number of information bits distribution of fine granularity until a reference sequence length Nref is reached, from which the short sequence may be derived either numerically or via a formula.

It may be further observed that the relationship of the allocation of information bits may be derived based on mutual information and may be applied recursively to determine the information bit location in conjunction with a short reliability sequence.

For control channels, a FRActally eNhanced KErNal (FRANKEN) polar code, which is based on information bit allocation ratio and short sequence discussed in previous sections, may be used. For nesting, a small reference sequence may be used, to create a bit allocation. For downlink control, a base reference sequence may be used. In some examples, Nref=64, which coincides with the PDCCH design with aggregation level (AL) 1. For PDCCH, for the same K, N may double each time it goes to a higher AL. Recursive allocation of information bits may be applied to different ALs by applying the recursion multiple times.

A polar code may be constructed by determining a number of information bits in each sector K0, K1, K2, K3 (where K=K0+K1+K2+K3, or at finer granularity) based on an information bit allocation ratio. A short base sequence (obtained via density evolution or other methods) may be used to determine the information bit location of a small reference length. For example, when a base sequence of length Nref=64 is used, the number of information bits in a first sector K2 and a second sector K3 may be determined based at least in part on a reliability formula. The number of information bits in a third sector K0 and a fourth sector K1 may be used to determine the distribution of K0 within the first 256 bits and the distribution of K1 within the second 128 bits. The information bit location may be determined based on the Ki distribution in each sector of 64 bits.

It should be noted that, due to the low rate nature of high AL, the upper part of the group may have very sparse info bit allocation. However, is the upper part of the group may not be utilized in a long sequence based design. Based on the information bit allocation, many other optimizations may be done performed, e.g., on complexity and performance tradeoffs.

In an example of capacity calculation based sequence where N=512 and K sweep={32, 48, 64, 80, 96}, the information bit allocation may be:

| Information Bit Allocation= | | | | | | |
| --- | --- | --- | --- | --- | --- | --- |
| 32 | 48 | 64 | 80 | 96 | K | |
| 0 | 0 | 0 | 0 | 0 | K0 in [0, 191] | 192 |
| 1 | 2 | 5 | 7 | 10 | K1 in [192, 255] | 64 |
| 0 | 0 | 0 | 0 | 1 | K2 in [256, 319] | 64 |
| 2 | 4 | 7 | 11 | 15 | K3 in [319, 384] | 64 |
| 3 | 7 | 11 | 16 | 20 | K4 in [384, 447] | 64 |
| 26 | 35 | 41 | 46 | 50 | K5 in [448, 511] | 64 |

A similar design may be used for uplink control channels.

Compared with FRANKEN and short sequence based construction, long sequence based design may not be practically feasible for online code construction, which may involve high bit-precision to calculate reliability indices and high complexity and latency of sorting operation for reliability. Long sequence design also may not shed any insight on the actual information bit distribution at different stages of polarization. For large block size N (for PDCCH large AL) where typically code rate is low, the W− part of the code may have very sparse info bit allocation, which could be exploited and further optimized by considering multiple short sequences Long sequence design further may not be easily extended to a different type of channels, where the LLRs are less Gaussian like at least in the first few stages of polarization (e.g., considering the effect of puncturing/shortening in hits not transmitted together with AWGN noise in bits that are transmitted through a channel). Iii some examples, different channel realizations may be easily incorporated at least in the first a few stages of information bit allocation calculation without running numerical density evolution every time. It may also be based on a linear interpolated curves from different channels.

One design decision in DL/UL control channel is to decide between an extension to a lower rate coding and repetition. In general, the gain may be difficult to quantify; however, based on the info bit distribution, it may be easy to quantify the potential coding gain upper bound by assuming an optimal information bit allocation while top information bits are received successfully. This may guide the polar code design to tradeoff performance and decoding complexity. The following may be considered in control channel design:

1) Limiting the Nmax value for complexity saving when performance gain is diminishing based on information bit allocation ratio calculation.

2) Optimizing the top part low rate code after polarization (e.g., limiting the max number of information bits to control complexity) to achieve complexity and performance tradeoffs After evaluating a short sequence based design (with Nref=64) and comparing with a long sequence based design (Nmax=512), code block lengths and payload sizes may be optimized over DL PDCCH typical values, where:

$N=\{128, 256, 512\}$ and $K=\{32, 48, 64, 80, 96\}$.

Note that, in some examples, a short sequence in conjunction with a capacity formula may yield the same information bit location for the polar code. For the cases where some information bits are different, due to the better scalability, more justified information bit allocation over a wide range of channels, short sequence with nested extension based FRANKEN polar code design for control channels may be beneficial. Other observations are as follows:

1) A short sequence with nested extension design may have similar and in some cases the same performance as a long sequence over an additive white Gaussian noise (AWGN) channel and may be easily adapted to other channels.

2) Online polar code construction may be more feasible using short sequence with nested extension design.

3) Polar code design for different classes of channels may be more feasible with short sequence based design.

In some examples, a short sequence with nested extension design of polar codes for control channel may be used. The performance of such an example may be evaluated and compared, and the following summary of observations may be made.

1) For each step of polarization, a W− channel may be equivalent to W+ channel. Based on the same input to W− and W+ channels, reliability ordering within W− and W+ may stay the same.

2) The relationship of information bits allocation derived based on mutual information may be applied recursively to determine information bit location in conjunction with a short reliability sequence.

3) A short sequence with nested extension design may have similar and in some cases substantially the same performance as a long sequence over an AWGN channel and may be easily adapted to other channels. In some examples, such a sequence may have better performance under low encoding and/or decoding complexity.

4) Online polar code construction may be more feasible using a short sequence with nested extension design 5) Polar code design for different classes of channels (e.g., puncturing/shortening) may be more feasible with a short sequence based design Determination of information bit location/distribution is an aspect of polar code design, and traditional approaches may have certain drawbacks. For example, density evolution based construction is numerical and SNR dependent. Offline construction may utilize a large amount of memory for storage, whereas online construction may utilize a large amount of computation. Neither approach may be scalable to a moderate block length. Additionally, optimization for different channels may difficult.

As described herein, it may be possible to determine a number of information bits in each of one or more groups K0, K1, K2, K3 (where K=K0+K1+K2+K3, and to finer granularity K00, K01, K02, K03, K10, K11) based on a reliability metric (capacity, information rate or other variations, e.g., finite block length approximations for different channels) formula. To do so, a short base sequence (obtained via density evolution or other methods) may be used to determine the information bit location of small length.

For example, a base sequence may have a length Nref=64, K2 and K3 may be determined based on a reliability formula and further based on K0, K1 values, and the distribution of K0 within the 1st 256 bits and distribution of K1 within the 2nd 128 bits may be determined. Thus, information bit location based on Ki distribution in each sector of 64 bits may be determined.

For each polar code, given an information rate=K/N as mutual information input, the mutual information output of the upper part (channel after XOR) R0 and the lower part R1 (channel after repetition) may be derived from a mutual information transfer chart. The mutual information transfer chart establishes the relationship between W and W+/W− and the information bit distribution may be derived from the following:

$K\_upper=R0*(N/2)$ $K\_lower=R1*(N/2)$

The above equation may be applied recursively to get number of information bit location of fine granularity. For instance, the information bit distribution may be derived as follows:

$K\_00=R00*(N/4)=Cap(W--)*(N/4)$ $K\_01=R01*(N/4)=Cap(W-+)*(N/4)$ $K\_10=R10*(N/4)=Cap(W+-)*(N/4)$ $K\_11=R11*(N/4)=Cap(W++)*(N/4)$ $K=K00+K01+K10+K11$, $Cap(W)=(Cap(W--)+Cap(W-+)+Cap(W+-)+Cap(W++))/4$

Further, recursion may be used in the presence of puncturing by applying recursively to obtain finer granularity of K values in each small group, and the information bit distribution may be derived as (assume N is code block length before puncturing):

$K\_00=0$ due to puncturing $K\_01=R01*(N/4)=Cap(W-)*(N/4)$ $K\_b\ 10=R10*(N/4)=Cap(W\pm(2rep)-)*(N/4)$ $K\_11=R11*(N/2)=Cap(W+(3rep))*(N/4)$ $K=K00+K01+K10+K11$ A similar scheme may be applied when a smaller or bigger portion is to be punctured. In another example, the information allocation scheme may be used for a different length of N after puncturing.

In the example above: N=64 case, a direct look up table (LUT) of N=64 reference sequence may be used.

For N=128 case, information bit K may be determined based on:

$K\_upper=R0*(N/2)$ $K\_lower=R1*(N/2)$

For N=256 case, information bit K allocation may be determined based on:

$K\_00=R00*(N/4)=Cap(W--)*(N/4)$ $K\_01=R01*(N/4)=Cap(W-+)*(N/4)$ $K\_10=R10*(N/4)=Cap(W+-)*(N/4)$ $K\_11=R11*(N/4)=Cap(W++)*(N/4)$ $K=K00\pm K01+K10+K11$, $Cap(W)=(Cap(W--)+Cap(W-+)+Cap(W+-)+Cap(W++))/4$

For N=192 case, information bit K allocation may be determined based on:

$K\_00 = 0$ due to puncturing $K\_01 = R01 * (N/4) = \text{Cap}(W-) * (N/4)$ $K\_10 = R10 * (N/4) = \text{Cap}(W \pm (2\text{rep})-) * (N/4)$ $K\_11 = R11 * (N/2) = \text{Cap}(W+(3\text{rep})) * (N/4)$ $K = K00 + K01 + K10 + K11$ In some cases, a polar code may be transmitted in an IR-HARQ where in a first transmission N_1tx bits are received, and in second transmission a total of N_2tx bit are received, and so on. The total number of coded bits after each transmission may be viewed as an punctured version of a long code (or extended version of short code) and the recursive scheme, as discussed herein, may be used to determine info bit allocation for the corresponding coded bit length after each transmission.

For instance, an incremental redundancy Hybrid Automatic Repeat Request (IR-HARQ) may include copying some unreliable information bits in the first transmission to more reliable bits in new locations but determining how many bits to copy is inefficient and not optimal. According to techniques discussed herein, puncturing may begin from the top in the U domain, but the scheme applies in general to determine how many bits to be copied on the second transmission when M2=M1 or to determine how many bits to be copied on the second transmission when M2 is not equal to M1 (where some puncturing occurs). Similar recursion may be applied to the more general case of IR-HARQ with an arbitrary number of retransmissions. In two examples:

1) First transmission $N\_1tx=64$, and second transmission $N\_2tx=64+128=192$

2) First transmission $N\_1tx=128$, second transmission $N\_2tx=128+64=192$

In some examples, a linear interpolated curve of the BEC and/or AWGN curves (e.g., a plot of a percentage=K0/K as a function of different channels) may be used to design for mixed Gaussian and erasure channel, and may be used to design polar codes for different channels without running numerical density evolution every time.

Such techniques may be scalable and extendable as a base sequence may be used to extend to arbitrarily long length, to different block lengths, or for aggregation levels for control channel, etc. This approach may improve design of polar codes for different channels without running numerical density evolution every time (e.g., by using a mixed BEC and AWGN channel curve to design for mixed Gaussian and erasure channel, as described above). This may also be applied to design general linear block/convolutional code concatenation or to determine the code rate of each component code.

In some examples, to design a polar code that is not a power of 2, the distribution of info bits may be computed similarly for overall (N, K) code:

$N = N0 + N1 + N2 + N3$ $N0=288, N1=144, N2=72, N3=72$

Alternatively, for N=576, N may be decomposed into N=512 (with 448 punctured or shortened bits), N1=256, N2=128, and N3=128. K0, K1, K2, K3 may be derived in accordance with techniques described above. For DL control channels of different aggregation levels, the code length N may grow with power of 2 scaling and rate matching may be done at AL1, every time, and further polarized with $N0*2^m$.

As the upper part of the polar graph may sparse (i.e., the distribution of information bits may be concentrated on the lower part of the graph), a sequence of short length may be sufficient for the purpose of PDCCH and different sectors may potentially use different sequences to enhance performance/complexity.

Additionally or alternatively, recursion for different ALs for the same K may be performed as follows:

For the same K different $N*2^m$ for different m, redistribute K for different ALs from low AL to high AL. Further, K may be split into K0, K1 every time AL doubles. From high AL to low AL, dedistribute Ki to K0~K(i-1) based on the current ratio among them. An example of AL8 K distribution is as follows:

72, 72, 144, 288
K0, K1, K2, K3

Example AL 4 distribution is as follows:
72, 72, 144
K0'=K0+delta(K0)   K1'=K1+delta(K1)   K2'=K2+delta(K2), <=K3

Example AL 2 distribution is as follows:
72, 72, 144
K0"=K0+delta(K0'), K1"=K1+delta(K1')<=K2'

Example AL 1 distribution is as follows:
K0'''=K.

This scheme may be used to analyze when repetition provides sufficient performance gain. Furthermore, the techniques herein may be used to approximate the value of Ki using certain approximation curves as a function of K and N.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A time division multiple access (TDMA) system may implement a radio technology such as Global System for Mobile Communications (GSM).

An orthogonal frequency division multiple access (OFDMA) system may implement a radio technology such as Ultra Mobile Broadband (LIMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LIE) and LTE-Advanced (LTE-A) are releases of Universal Mobile Telecommunications System (UMTS) that use E-UTRA. UTRA, E-UTRA, UMTS, LTE, LTE-A, NR, and Global System for Mobile communications (GSM) are described in documents from the organization named "3rd Generation Partnership Project" (3GPP). CDMA2000 and UMB are described in documents from art organization named "3rd Generation Partnership Project 2" (3GPP2). The techniques described herein may be used for the systems and radio technologies mentioned above as well as other systems and radio technologies. While aspects an LTE or an NR system may be described for purposes of example, and LTE or NR terminology may be used in much of the description, the techniques described herein are applicable beyond LIE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, gNB or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), next generation NodeB (gNB), Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations), The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples, A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB, An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

In this manner, by allocating information bits based on mutual information (e.g., based on a mutual information transfer chart), by leveraging the reliability ordering invariant property and/or employing a base sequence of a length (e.g., less than the block length or size), the present methods and apparatus may avoid using a large amount of storage and/or resources and/or avoid computational complexity. The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine, A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (tor example, a list of items prefaced by a phrase such as "at least one of" or "one or more of") indicates an inclusive list such that, for example, a phrase referring to "at least one of" a list of items refers to any combination of those items, including single members. As an example, "at least one of: a, b, or c" is intended to cover a, b, c, a-b, a-c, b-c, and a-b-c., as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for encoding by an encoder, comprising:
   identifying a plurality of channel instances of a channel associated with transmission of a vector comprising a first plurality of information bits, wherein the plurality of channel instances are recursively polarized into one or more groups;
   allocating the first plurality of information bits among the one or more groups based at least in part on a reliability metric associated with the channel;
   performing an encoding operation to encode the vector based at least in part on the allocation of the first plurality of information bits among the one or more groups and a size of at least one of the one or more groups; and
   transmitting the encoded vector using the plurality of channel instances.

2. The method of claim 1, further comprising:
   retransmitting, using one or more of the plurality of channel instances, a portion of the encoded vector based at least in part on reception of a negative acknowledgement (NACK) message.

3. The method of claim 2, wherein retransmitting the portion of the encoded vector comprises:
   allocating, among the one or more groups, a second plurality of information bits associated with the portion of the encoded vector after reception of incremental redundancy hybrid automatic repeat request (IR-HARQ) transmission bits, the second plurality of information bits corresponding to a different set of bit locations from the first plurality of information bits in an initial transmission.

4. The method of claim 3, wherein:
   a bit location for at least one of the first plurality of information bits during transmission of the encoded vector is different from a bit location for a respective information bit of the second plurality of information bits after reception of the initial transmission and retransmission of the encoded vector.

5. The method of claim 3, wherein bit locations for each of the first plurality of information bits are different from bit locations of respective information bits of the second plurality of information bits, the method further comprising:
   copying non-overlapping bit locations between the first plurality of information bits and the second plurality of information bits with redundant bits.

6. The method of claim 1, wherein:
   the vector comprises a plurality of encoded bits determined based at least in part on a vector of encoded input bits comprising a set of information bits and a set of frozen bits.

7. The method of claim 1, wherein:
   the reliability metric is associated with one or more channel instances of the plurality of channel instances after a polarization operation.

8. The method of claim 1, further comprising:
   storing a base sequence corresponding to a given group size and a given location of the given group; and
   determining one or more information bit locations for a group based at least in part on a number of information bits allocated to the group and the associated base sequence.

9. The method of claim 1, further comprising:
   storing one or more base sequences, each of the one or more base sequences based on at least one of a given group size or a given location of the given group.

10. The method of claim 9, wherein:
    each of the one or more base sequences is determined based at least in part on a density evolution technique, a density evolution based at least in part on a Gaussian approximation technique, a mutual information technique, a mean square error density evolution technique, a polarization weight technique, or a numerical computer search based on simulations.

11. The method of claim 9, wherein:
the allocating the first plurality of information bits among the one or more groups is based at least in part on a base sequence based on the size of at least one of the one or more groups.

12. The method of claim 9, wherein:
the given group size is constant for each of the given number of information bit locations.

13. The method of claim 1, wherein:
the reliability metric of the channel comprises a capacity of the channel, a reliability of the channel, an information rate of the channel, a mean square error of the channel, or combinations thereof.

14. The method of claim 1, wherein:
the encoding operation comprises at least one of a polar coding operation, a Reed-Muller (RM) coding operation, or a polar RM operation.

15. The method of claim 1, wherein the allocating the first plurality of information bits comprises:
determining a first output rate associated with a first group of the one or more groups; and
determining a number of information bits to be allocated to the first group based at least in part on the first output rate.

16. The method of claim 15, wherein:
the determining the first output rate is based at least in part on data indicating a relationship between one or more channel instances and the one or more channels before polarization.

17. The method of claim 16, wherein:
the data is for at least one of a binary erasure channel (BEC), a binary symmetric channel (BSC), an additive white Gaussian noise (AWGN) channel, or combinations thereof.

18. The method of claim 16, further comprising:
computing an information bit allocation for each of the first group and a second group of the one or more groups based at least in part on a total number of information bits to be allocated and the reliability metric.

19. The method of claim 15, wherein the allocating the first plurality of information bits further comprises:
determining a second output rate associated with a second group of the one or more groups; and
determining a number of information bits to be allocated to the second group based at least in part on the second output rate.

20. The method of claim 19, wherein:
an average of the first output rate and the second output rate equals the original channel rate before polarization.

21. The method of claim 20, wherein:
the first output rate is based at least in part on a size of the first group, the second output rate is based at least in part on a size of the second group, and the first and second output rates are based at least in part on a total number of information bits allocated to the first and second groups.

22. An apparatus for encoding by an encoder or decoding by a decoder, comprising:
means for identifying a plurality of channel instances of a channel associated with transmission of a vector comprising a first plurality of information bits, wherein the plurality of channel instances are recursively polarized into one or more groups;
means for allocating the first plurality of information bits among the one or more groups based at least in part on a reliability metric associated with the channel;
means for performing an encoding operation to encode the vector based at least in part on the allocation of the first plurality of information bits among the one or more groups and a size of at least one of the one or more of groups; and
means for transmitting the encoded vector using the plurality of channel instances.

23. An apparatus for encoding, in a system comprising:
a processor;
memory in electronic communication with the processor; and
one or more instructions stored in the memory and operable, when executed by the processor, to cause the apparatus to:
identify a plurality of channel instances of a channel associated with transmission of a vector comprising a first plurality of information bits, wherein the plurality of channel instances are recursively polarized into one or more groups;
allocate the first plurality of information bits among the one or more groups based at least in part on a reliability metric associated with the channel;
perform an encoding operation to encode the vector based at least in part on the allocation of the first plurality of information bits among the one or more groups and a size of at least one of the one or more groups; and
transmit the encoded vector using the plurality of channel instances.

24. The apparatus of claim 23, wherein:
the encoding operation comprises at least one of a polar coding operation, a Reed-Muller (RM) coding operation, or a polar RM operation.

25. The apparatus of claim 23, wherein the one or more instructions are further executable by the processor to:
retransmit, using one or more of the plurality of channel instances, a portion of the encoded vector based at least in part on reception of negative acknowledgement (NACK) message.

26. The apparatus of claim 24, wherein the one or more instructions are further executable by the processor to:
allocate, among one or more of the groups, a second plurality of information bits associated with the portion of the encoded vector, the second plurality of information bits corresponding to respective ones of the first plurality of information bits.

27. The apparatus of claim 26, wherein:
a bit location for at least one of the first plurality of information bits during transmission of the encoded vector is different from a bit location for a respective information bit of the second plurality of information bits after reception of the initial transmission and retransmission of the encoded vector.

28. The apparatus of claim 26, wherein bit locations for each of the first plurality of information bits are different from bit locations of respective information bits of the second plurality of information bits, wherein the one or more instructions are further executable by the processor to:
copy non-overlapping bit locations between the first plurality of information bits and the second plurality of information bits with redundant bits.

29. The apparatus of claim 23, wherein:
the vector comprises a plurality of encoded bits determined based at least in part on a vector of encoded input bits comprising a set of information bits and a set of frozen bits.

30. A non-transitory computer readable medium storing code for encoding, the code comprising one or more instructions executable by a processor to:
- identify a plurality of channel instances of a channel associated with transmission of a vector comprising a first plurality of information bits, wherein one or more of the plurality of channel instances are recursively partitioned into a plurality of sections;
- allocate the first plurality of information bits among one or more of the groups based at least in part on a reliability metric associated with the channel;
- perform an encoding operation to encode the vector based at least in part on the allocation of the first plurality of information bits among one or more of the groups and a size of at least one of one or more groups; and
- transmit the encoded vector using the plurality of channel instances.

* * * * *